US009312488B2

(12) United States Patent
Aonuma et al.

(10) Patent No.: US 9,312,488 B2
(45) Date of Patent: Apr. 12, 2016

(54) METHOD FOR MANUFACTURING ORGANIC ELECTROLUMINESCENT ELEMENT WITH BI-LAYER CATHODE

(71) Applicant: JOLED INC., Tokyo (JP)

(72) Inventors: Masaki Aonuma, Fukuoka (JP); Takuya Satoh, Kyoto (JP); Akira Takiguchi, Hyogo (JP); Yoichiro Yashiro, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/368,567

(22) PCT Filed: Mar. 8, 2013

(86) PCT No.: PCT/JP2013/001503
§ 371 (c)(1),
(2) Date: Jun. 25, 2014

(87) PCT Pub. No.: WO2014/020788
PCT Pub. Date: Feb. 6, 2014

(65) Prior Publication Data
US 2014/0349432 A1 Nov. 27, 2014

(30) Foreign Application Priority Data

Aug. 1, 2012 (JP) .................................. 2012-171343

(51) Int. Cl.
*H01L 51/00* (2006.01)
*H01L 51/52* (2006.01)
*C23C 14/08* (2006.01)

(52) U.S. Cl.
CPC .......... *H01L 51/0021* (2013.01); *C23C 14/086* (2013.01); *H01L 51/5234* (2013.01); *H01L 2251/308* (2013.01); *H01L 2251/5315* (2013.01)

(58) Field of Classification Search
CPC ........... H01L 51/0021; H01L 51/5234; H01L 2251/5315; H01L 2251/308; C23C 14/086
See application file for complete search history.

(56) References Cited

U.S. PATENT DOCUMENTS

| 5,232,790 | A | * | 8/1993 | Arimune et al. ........... 428/824.5 |
| 5,443,922 | A | | 8/1995 | Nishizaki et al. |
| 2002/0109458 | A1 | * | 8/2002 | Pichler et al. .................. 313/504 |
| 2005/0007014 | A1 | * | 1/2005 | Kurata .......................... 313/504 |
| 2005/0040759 | A1 | | 2/2005 | Kobayashi |
| 2010/0224390 | A1 | * | 9/2010 | Umeno ................... C03C 17/36 174/126.2 |
| 2014/0077188 | A1 | | 3/2014 | Aonuma et al. |
| 2014/0080241 | A1 | | 3/2014 | Aonuma |
| 2014/0138658 | A1 | | 5/2014 | Aonuma |

FOREIGN PATENT DOCUMENTS

| JP | 05-163488 | 6/1993 |
| JP | 2004-200146 | 7/2004 |

(Continued)

OTHER PUBLICATIONS

Search report from PCT/JP2013/001503, mail date is Apr. 9, 2013.

*Primary Examiner* — John P Dulka
(74) *Attorney, Agent, or Firm* — Greenblum & Bernstein, P.L.C.

(57) ABSTRACT

A method of forming an upper electrode in an organic electroluminescent element is provided. A first film made of a material for the upper electrode is formed on an organic functional layer by magnetron sputtering under a first condition. Thereafter, a second film made of the material for the upper electrode is formed on the first film by magnetron sputtering under a second condition different from the first condition. The second film has a lower film stress than the first film.

6 Claims, 22 Drawing Sheets

(56) References Cited

FOREIGN PATENT DOCUMENTS

| | | |
|---|---|---|
| JP | 2007-095338 | 4/2007 |
| JP | 2008-004361 | 1/2008 |
| JP | 2009-043614 | 2/2009 |
| JP | 2010-287383 | 12/2010 |
| JP | 2011-009020 | 1/2011 |
| WO | 2009/025118 | 2/2009 |
| WO | WO 2009025118 A1 * | 2/2009 |

* cited by examiner

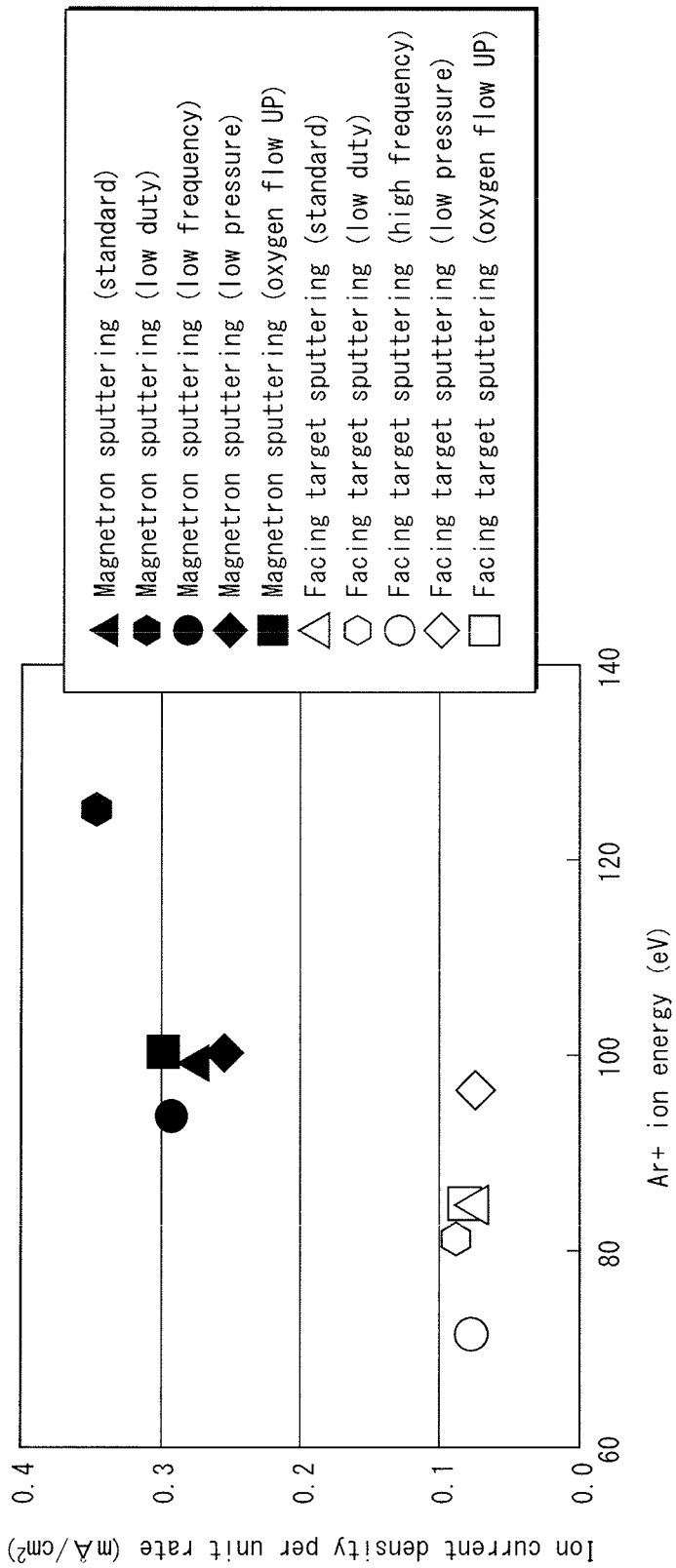

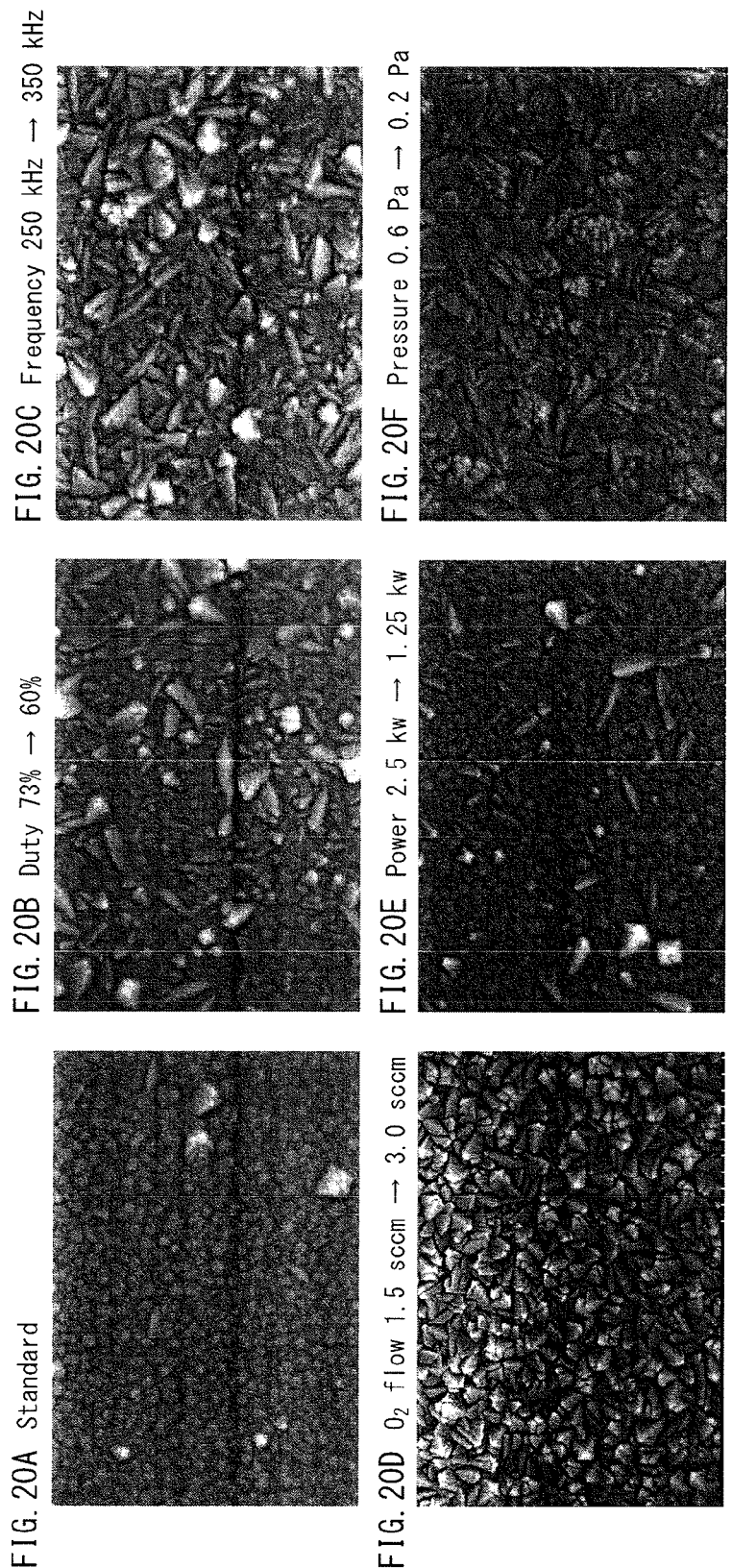
FIG. 20A Standard
FIG. 20B Duty 73% → 60%
FIG. 20C Frequency 250 kHz → 350 kHz
FIG. 20D O₂ flow 1.5 sccm → 3.0 sccm
FIG. 20E Power 2.5 kw → 1.25 kw
FIG. 20F Pressure 0.6 Pa → 0.2 Pa

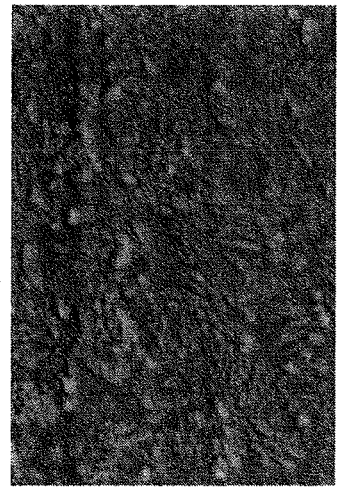
FIG. 21C Frequency 250 kHz → 100 kHz
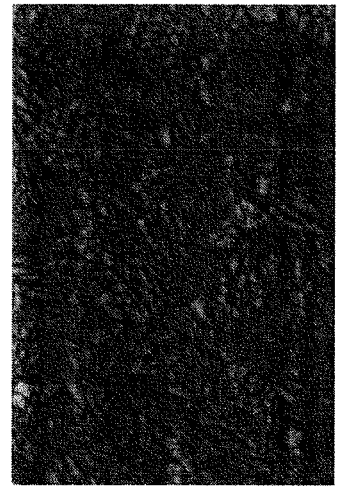
FIG. 21F Pressure 0.6 Pa → 0.5 Pa
FIG. 21B Duty 73% → 60%
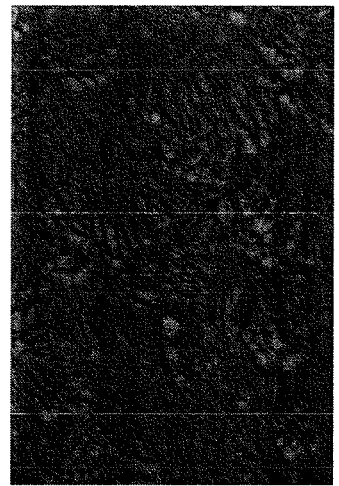
FIG. 21E Power 5.4 kw → 2.7 kw
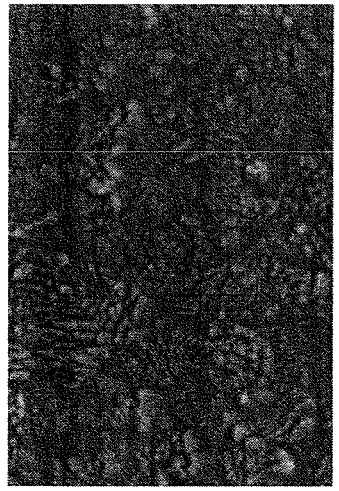
FIG. 21A Standard
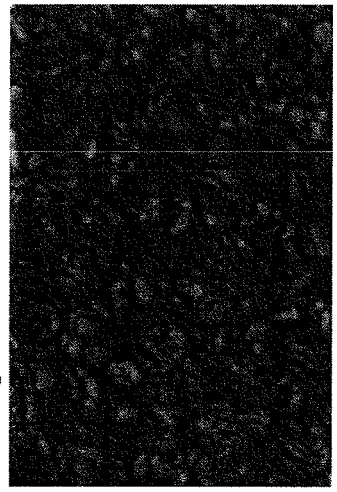
FIG. 21D O₂ flow 10 sccm → 15 sccm

METHOD FOR MANUFACTURING ORGANIC ELECTROLUMINESCENT ELEMENT WITH BI-LAYER CATHODE

TECHNICAL FIELD

The present invention relates to methods for manufacturing organic electroluminescent elements and, in particular, to technology for forming electrodes included in organic electroluminescent elements.

BACKGROUND ART

In recent years, organic electroluminescent elements making use of electroluminescence of organic materials have attracted attention. An organic electroluminescent element includes one or more organic functional layers between an upper electrode and a lower electrode, and is manufactured by forming, on a substrate, the lower electrode, the one or more organic functional layers, and the upper electrode in the stated order.

Various methods are known as a method for forming each of the lower electrode, the organic functional layers, and the upper electrode. In forming the upper electrode, methods such as sputtering, vapor deposition, spraying, and chemical vapor deposition (CVD) are used. In particular, Patent Literature 1 discloses technology for forming the upper electrode by using facing target sputtering.

CITATION LIST

Patent Literature

[Patent Literature 1]
Japanese Patent Application Publication No. 2007-95338

SUMMARY OF INVENTION

Technical Problem

In order to manufacture a highly-efficient, long-lived organic electroluminescent element, the upper electrode needs to have high electron injection properties into an organic functional layer. In formation of the upper electrode by using a conventional method such as facing target sputtering, however, sufficient electron injection properties cannot be obtained.

In addition, in a process of forming the upper electrode, a high film stress may remain in the upper electrode. As a result, peeling and cracking of the upper electrode can occur, thereby decreasing yield.

The present invention has been conceived in view of the above problems, and aims to provide a method for manufacturing an organic electroluminescent element that is less likely to cause peeling and cracking of an upper electrode, and has high electron injection properties from the upper electrode into an organic functional layer.

Solution to Problem

In order to achieve the above-mentioned aim, a method for manufacturing an organic electroluminescent element as one embodiment of the present invention is a method for manufacturing an organic electroluminescent element that includes: an electrode pair composed of an upper electrode and a lower electrode; and an organic functional layer disposed between the upper electrode and the lower electrode, the method comprising forming the upper electrode on the organic functional layer by magnetron sputtering, wherein forming the upper electrode includes: forming a first thin film made of a material for the upper electrode on the organic functional layer under a first condition; and forming a second thin film made of the material for the upper electrode on the first thin film under a second condition different from the first condition, the second thin film having a lower film stress than the first thin film.

Advantageous Effects of Invention

By magnetron sputtering, an electrode thin film having high electron injection properties into the organic functional layer can be formed on the organic functional layer.

By then forming, on the electrode thin film (the first thin film) thus formed by magnetron sputtering, an electrode thin film (the second thin film) having a lower film stress under a different condition, the film stress per unit thickness of the entire upper electrode can be decreased.

By thus forming the upper electrode having high electron injection properties into the organic functional layer and having a reduced film stress, a highly-efficient, long-lived organic electroluminescent element that is less likely to cause peeling and cracking of an upper electrode can be manufactured.

BRIEF DESCRIPTION OF DRAWINGS

FIG. 19 shows measurement results of plasma characteristics.

FIGS. 20A-20F show SEM photographs of ITO films formed by facing target sputtering.

FIGS. 21A-21F show SEM photographs of ITO films formed by magnetron sputtering.

DESCRIPTION OF EMBODIMENT

Figure 1:
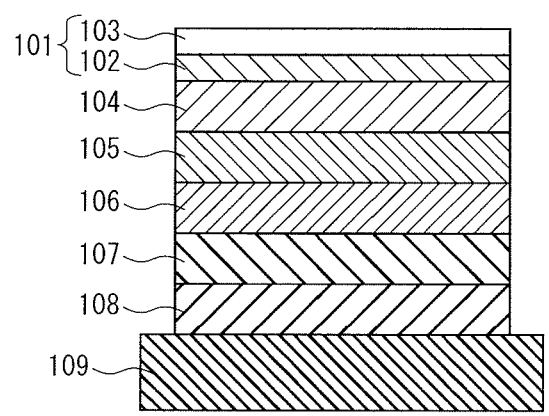
FIG. 1 is a sectional view showing one example of the structure of an organic electroluminescent element 100.

<<Findings Underlying One Embodiment of Present Invention>>

The findings underlying one embodiment of the present invention are described first.

An organic electroluminescent element includes one or more organic functional layers between an upper electrode and a lower electrode, and is manufactured by forming, on a substrate, the lower electrode, the one or more organic functional layers, and the upper electrode in the stated order.

In a process of manufacturing the organic electroluminescent element, energy is provided for a target material by using heat, plasma, and the like to cause particles of an electrode material constituting the target material to adhere to and accumulate on an underlayer for film formation, and, as a result, an electrode is formed.

Since energy is provided for the target material by using heat, plasma, and the like, an organic functional layer, which is the underlayer, might be affected by heat, plasma, and the like, and damaged in a process of forming the upper electrode on the organic functional layer. The damage to the organic functional layer leads to degradation of properties, such as a drive voltage and an element lifetime, of the organic electroluminescent element.

To address this problem, in the process of forming the upper electrode, a method such as vapor deposition and facing target sputtering is used to prevent degradation of properties, such as a drive voltage and an element lifetime, of the organic electroluminescent element caused by the damage to the organic functional layer, which is the underlayer.

In the case of forming the upper electrode by using the conventional method such as facing target sputtering and vapor deposition, however, sufficient device performance cannot be obtained. As organic electroluminescent elements become more prevalent, further improvement in device performance such as an element lifetime and light-emitting efficiency is required, raising expectations for a method for manufacturing a more highly-efficient, longer-lived organic electroluminescent element different from the conventional method.

The inventors found, as a result of intense study, that use of magnetron sputtering, and preferably use of magnetron sputtering in a high energy process in forming the upper electrode on the organic functional layer increases adhesion between the upper electrode and the organic functional layer, and provides a high-efficient, long-lived organic electroluminescent element having high electron injection properties from the upper electrode into the organic functional layer.

Use of magnetron sputtering, however, increases a film stress of a thin film as formed, because high-energy sputtered particles collide with a growth face of the film. Accordingly, a high film stress might remain in the upper electrode, leading to peeling and cracking of the upper electrode.

The inventors focused on the film stress of the upper electrode, and arrived at one embodiment of the present invention described below.

<<Summary of One Embodiment of Present Invention>>

A method for manufacturing an organic electroluminescent element as one embodiment of the present invention is a method for manufacturing an organic electroluminescent element that includes: an electrode pair composed of an upper electrode and a lower electrode; and an organic functional layer disposed between the upper electrode and the lower electrode, the method comprising forming the upper electrode on the organic functional layer by magnetron sputtering, wherein forming the upper electrode includes: forming a first thin film made of a material for the upper electrode on the organic functional layer under a first condition; and forming a second thin film made of the material for the upper electrode on the first thin film under a second condition different from the first condition, the second thin film having a lower film stress than the first thin film.

In a specific aspect of the method for manufacturing the organic electroluminescent element according to one embodiment of the present invention, the first condition and the second condition each include a condition relating to power density during film formation, and the second condition indicates a lower power density than the first condition.

In a specific aspect of the method for manufacturing the organic electroluminescent element according to one embodiment of the present invention, the first condition indicates a power density of between 4.5 W/cm$^2$ and 9.0 W/cm$^2$ inclusive.

In a specific aspect of the method for manufacturing the organic electroluminescent element according to one embodiment of the present invention, the first condition and the second condition each include a condition relating to ambient gas pressure, and the second condition indicates a higher ambient gas pressure than the first condition.

In a specific aspect of the method for manufacturing the organic electroluminescent element according to one embodiment of the present invention, the upper electrode is a cathode, the lower electrode is an anode, the organic functional layer is composed of a plurality of layers including an electron transport layer, and in forming the upper electrode, the cathode is formed on the electron transport layer, the cathode being made of a light-transmissive electrically-conductive material.

In a specific aspect of the method for manufacturing the organic electroluminescent element according to one embodiment of the present invention, the light-transmissive electrically-conductive material is made of an oxide containing at least one selected from the group consisting of In, Ti, Zn, and Sn.

<<Embodimen>>

(Embodiment 1)

The following describes an embodiment of the present invention with reference to the drawings.

[Structure of Organic Electroluminescent Element]

The structure of an organic electroluminescent element according to one embodiment of the present invention is described first. FIG. 1 is a sectional view showing one example of the structure of an organic electroluminescent element 100 according to one embodiment of the present invention. As shown in FIG. 1, the organic electroluminescent element 100 includes a cathode 101, an electron transport layer 104, a light-emitting layer 105, a hole transport layer 106, a hole injection layer 107, an anode 108, and a substrate 109. Further, the cathode 101 is composed of a first cathode layer 102 and a second cathode layer 103. The following describes the above-mentioned components.

<Cathode>

The cathode 101 has a function to inject electrons into the electron transport layer 102. Examples of a material for the cathode 101 are indium tin oxide (ITO), indium zinc oxide (IZO), silver (Ag), aluminum (Al), an alloy of silver, palladium, and copper, and an alloy of silver, rubidium, and gold, an alloy of molybdenum and chromium (MoCr), and an alloy of nickel and chromium (NiCr).

Especially in a top-emission type organic electroluminescent element that emits light from a cathode-side thereof, a light-transmissive electrically-conductive material made of an oxide containing at least one of In, Ti, Zn, and Sn, such as ITO, IZO, ZnO, and TiO$_2$, is used.

The cathode 101 is herein composed of the first cathode layer 102 and the second cathode layer 103. As described in detail later, the first cathode layer 102 and the second cathode layer 103 are both formed by magnetron sputtering, but have different film stresses because they are formed under different conditions.

The first cathode layer 102 is provided to increase adhesion between the cathode 101 and the electron transport layer 104, and to obtain high electron injection properties from the cathode 101 into the electron transport layer 104. Specifically, the first cathode layer 102 is an electrode film formed by magnetron sputtering, and preferably by magnetron sputtering in a high energy process. By using magnetron sputtering, an electrode thin film having high adhesion to the electron transport layer as an underlayer and having high electron injection properties can be formed.

In the meantime, in magnetron sputtering, high-energy sputtered particles collide with a growth face of a film, and thus the first cathode layer 102 has a high film stress that is higher than a film stress of the electron transport layer 104 as the underlayer.

The second cathode layer 103 is provided to reduce the film stress of the cathode 101. Specifically, the second cathode layer 103 is an electrode film formed by magnetron sputtering under a different condition from the first cathode layer 102, and has a lower film stress than the first cathode layer 102.

The film stress includes a compressive stress and a tensile stress. A thin film formed by magnetron sputtering typically exhibits the compressive stress. That is to say, a lower film stress than the first cathode layer 102 means herein a lower compressive stress than the first cathode layer 102.

By thus providing, on the electron transport layer 104 as the underlayer, the first cathode layer 102 having a higher film stress than the electron transport layer 104 and having high adhesion to the underlayer, and providing, on the first cathode layer 102, the second cathode layer 103 having a low film stress, the cathode 101 has high adhesion to the electron transport layer 104, and has a reduced film stress. Since the cathode 101 has high adhesion to the electron transport layer 104, high electron injection properties from the cathode 101 into the electron transport layer 104 can be obtained. Furthermore, since a film stress per unit thickness of the cathode 101 is reduced, peeling and cracking of the cathode 101 is less likely to occur.

<Electron Transport Layer>

The electron transport layer 104 has a function to transport electrons injected from the cathode 101 to the light-emitting layer 105. Examples of a material for the electron transport layer 104 are a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, and a quinoline complex derivative (each listed in Japanese Patent Application Publication No. 5-163488), a phosphorus oxide derivative, a triazole derivative, a triazine derivative, a silole derivative, a dimesitylboron derivative, and a triarylboron derivative.

<Light-Emitting Layer>

The light-emitting layer 105 is a portion for emitting light by recombination of carriers (holes and electrons). Examples of a material for the light-emitting layer 105 are an oxinoid compound, perylene compound, and coumarin compound.

<Hole Transport Layer>

The hole transport layer 106 has a function to transport holes injected from the anode 108 to the light-emitting layer 105. Examples of a material for the hole transport layer 106 are an aromatic tertiary amine derivative and a phthalocyanine derivative.

<Hole Injection Layer>

The hole injection layer 107 has a function to promote injection of holes from the anode 108 into the hole transport layer 106. Examples of a material for the hole injection layer 107 are metal oxide, metal nitride, and metal oxynitride. Examples of the metal oxide are molybdenum oxide (MoOx), tungsten oxide (WOx), and molybdenum-tungsten oxide (MoxWyOz).

<Anode>

The anode 108 has a function to inject holes into the hole injection layer 107. Examples of a material for the anode 108 are silver (Ag), aluminum (Al), an alloy of silver, palladium, and copper, and an alloy of silver, rubidium, and gold, an alloy of molybdenum and chromium (MoCr), an alloy of nickel and chromium (NiCr), indium tin oxide (ITO), and indium zinc oxide (IZO).

In a bottom-emission type organic electroluminescent element that emits light from a substrate-side thereof, a light-transmissive material such as ITO and IZO is used.

In a top-emission type organic electroluminescent element that emits light from a cathode-side thereof, a light-reflective material is used.

In the top-emission type organic electroluminescent element, a reflecting electrode may be provided between the anode 108 and the substrate 109.

<Substrate>

The substrate 109 serves as a base for the organic electroluminescent element. The organic electroluminescent element is manufactured by sequentially stacking, on the substrate 109, the anode, the organic functional layers, and the cathode. An example of a material for the substrate 109 is an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

<Others>

Although not illustrated in FIG. 1, a sealing layer is provided on the cathode 101 for the purpose of preventing the organic functional layers from deteriorating due to being exposed to moisture and air. In the case of the top-emission type organic electroluminescent element, an example of a material for the sealing layer is a light-transmissive material such as silicon nitride (SiN) and silicon oxynitride (SiON).

This concludes the description of the structure of the organic electroluminescent element according to Embodiment 1.

[Method for Manufacturing Organic Electroluminescent Element]

Figure 2:
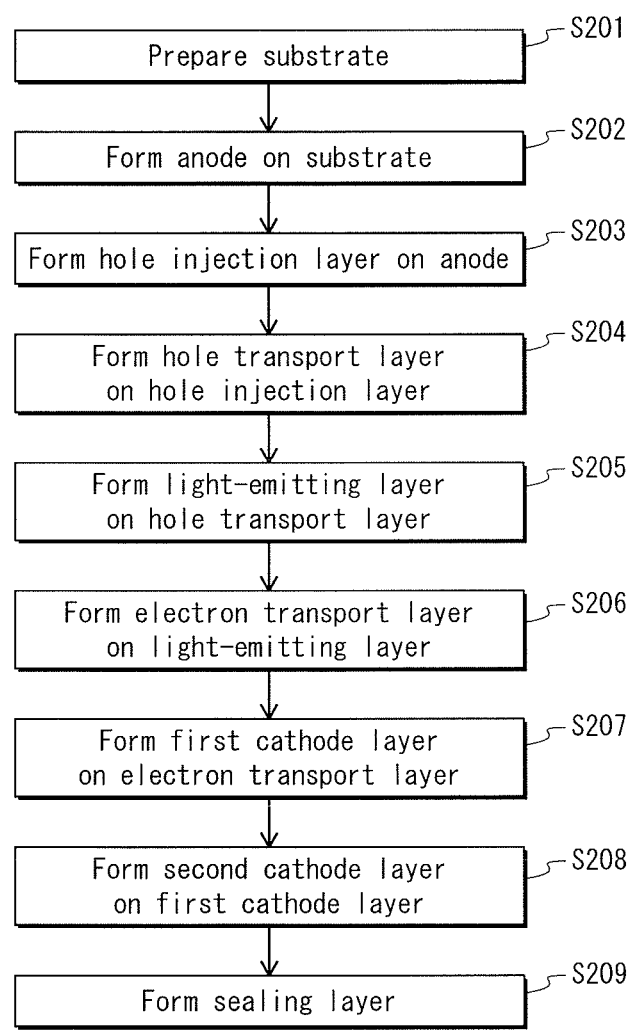
FIG. 2 is a flow chart showing a process of manufacturing an organic electroluminescent element.

A method for manufacturing the organic electroluminescent element according to Embodiment 1 is described next. FIG. 2 is a flow chart showing a process of manufacturing the organic electroluminescent element according to Embodiment 1.

As shown in FIG. 2, the substrate 109 serving as a base for the organic electroluminescent element is prepared (step S201), and the anode 108 is formed on the substrate 109 (step S202). The anode 108 is formed by a method such as vapor deposition and sputtering.

Organic functional layers are then formed on the anode 108 (steps S203 through S206).

Specifically, the hole injection layer 107 is first formed on the anode 108 (step S203). After forming the hole injection layer 107, the hole transport layer 106 is formed on the hole injection layer 107 (step S204). After forming the hole transport layer 106, the light-emitting layer 105 is formed on the hole transport layer 106 (step S205). After forming the light-emitting layer 105, the electron transport layer 104 is formed on the light-emitting layer 105 (step S206). These organic functional layers are formed by a method such as vapor deposition and application using an inkjet device.

After forming the organic functional layers, the cathode 101 is formed on the electron transport layer 104 (steps S207 and S208).

A process of forming the cathode includes: a primary film-formation step of forming the first cathode layer 102 on the electron transport layer 104 by magnetron sputtering (step S207); and a secondary film-formation step of forming the second cathode layer 103 on the first cathode layer 102 by magnetron sputtering under a different condition from the primary film-formation step. The primary film-formation step and the secondary film-formation step are described in detail later.

After forming the cathode, the sealing layer is formed on the cathode 101 (step S209).

By thus sequentially stacking, on the substrate 109, the anode, the organic functional layers, and the cathode, the organic electroluminescent element is manufactured.

[Details of Primary Film-formation Step of Cathode Formation]

The following describes details of the primary film-formation step of cathode formation. In the primary film-formation step, the first cathode layer 102 is formed on the electron transport layer 104 by magnetron sputtering.

Figure 3:
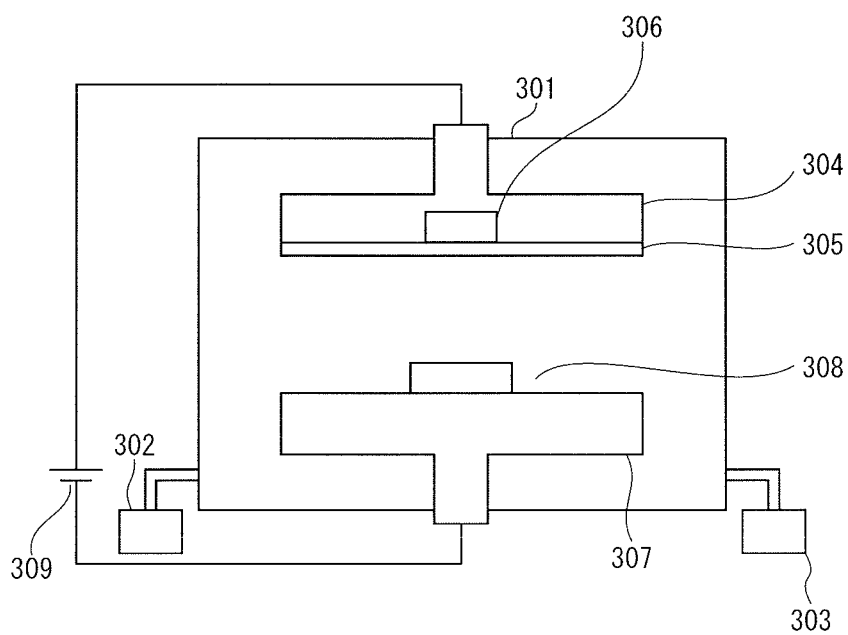
FIG. 3 shows the structure of a magnetron sputtering device 300.

FIG. 3 shows one example of the structure of a magnetron sputtering device 300. As illustrated in FIG. 3, the magnetron sputtering device 300 includes: a sputtering chamber 301; a gas supply system 302; an exhaust system 303; a backing plate 304; a target 305; a magnet 306; a mount 307; a film-forming substrate 308 subject to film formation and including the substrate 109 and the organic functional layers formed on the substrate 109; and a power supply 309.

The magnetron sputtering device 300 includes the sputtering chamber 301, and performs sputtering in the sputtering chamber 301.

To the sputtering chamber 301, the gas supply system 302 for introducing a sputtering gas into the sputtering chamber 301, and the exhaust system 303 for depressurizing the sputtering chamber 301 so that the pressure in the sputtering chamber 301 becomes a predetermined pressure are connected. An inert gas such as argon (Ar) is used as the sputtering gas.

The film-forming substrate 308 targeted for film formation is provided on the mount 307 housed in the sputtering chamber 301. The target 305, which is made of a material used for film formation and has a plate-like shape, is provided on the backing plate 304 housed in the sputtering chamber 301. The magnet 306 is provided on the rear of the target 305.

The power supply 309 applies voltage to the target 305. Although the power supply 309 is a DC power supply in the example illustrated in FIG. 3, the power supply 309 may be an AC power supply or an AC/DC hybrid power supply.

When the exhaust system 303 evacuates the sputtering chamber 301, the gas supply system 302 introduces a sputtering gas into the sputtering chamber 301, and the power supply 309 applies voltage to the target 305, plasma of the sputtering gas is generated, and a surface of the target 305 is sputtered.

By providing the magnet 306 on the rear of the target 305, a magnetic field parallel to the surface of the target 305 is generated. Ions of the sputtering gas collide with the surface of the target 305, and dislodge secondary electrons from the target 305. The secondary electrons are captured by using Lorentz force generated by the magnetic field on the surface of the target 305, and caused to make a cycloidal or trochoidal motion, so that high-density plasma can be generated in the vicinity of the target 305.

With the above-mentioned structure of the device, in magnetron sputtering, a thin film can be formed by using high-energy sputtered particles. In the primary film-formation step of cathode formation according to one embodiment of the present invention, since the first cathode layer 102 is formed on the electron transport layer 104 by magnetron sputtering, the first cathode layer 102 has high adhesion to the electron transport layer 104.

In the primary film-formation step of cathode formation, it is preferred to form the first cathode layer 102 by magnetron sputtering in a high energy process. More specifically, it is preferred to form the first cathode layer 102 by magnetron sputtering with a power density during film formation of between 4.5 W/cm$^2$ and 9.0 W/cm$^2$ inclusive. By forming the first cathode layer 102 by magnetron sputtering in a high energy process, adhesion to the electron transport layer 104 as the underlayer can be increased, and high electron injection properties from the cathode 101 into the electron transport layer 104 can be obtained. The power density during film formation refers to a power during film formation per unit target area. Magnetron sputtering in a high energy process is described later.

[Details of Secondary Film-formation Step of Cathode Formation]

The following describes details of the secondary film-formation step of cathode formation. In the secondary film-formation step, the second cathode layer 103 is formed on the first cathode layer 102 by magnetron sputtering under a different condition from the primary film-formation step. Specifically, the second cathode layer 103 is formed so as to have a lower film stress by reducing the power density and raising an ambient gas pressure in the primary film-formation step.

By forming the second cathode layer 103 having a low film stress on the first cathode layer 102 having high adhesion to the electron transport layer 104 as the underlayer, a film stress per unit thickness of the cathode 101 is reduced. As a result, high electron injection properties from the cathode 101 into the electron transport layer 104 can be obtained, and the occurrence of peeling and cracking of the cathode 101 can be reduced.

[Experiments]

In order to confirm utility of the method for manufacturing the organic electroluminescent element according to the present embodiment, experiments were conducted on electron injection properties and a film stress of the cathode.

First, ITO electrodes having different thicknesses were formed on respective electron transport layers by magnetron sputtering, and electron injection properties from the ITO electrode into the electron transport layer were examined. Specifically, values of the current density were measured by applying voltage across electrodes with respect to the following two samples: [1] a 16 nm thick IZO electrode, an 80 nm thick electron transport layer, and a 35 nm thick ITO electrode (Sample 1); and [2] a 16 nm thick IZO electrode, an 80 nm thick electron transport layer, and a 100 nm thick ITO electrode (Sample 2).

Conditions during film formation by magnetron sputtering in both of the samples indicate: a power of 5.4 kW; an ambient gas pressure of 0.6 Pa; and an $Ar/O_2$ gas flow of 200/10 sccm. The power of 5.4 kW as converted into the power density, which refers to a power per unit target area, is 9.0 W/cm².

Figure 4:
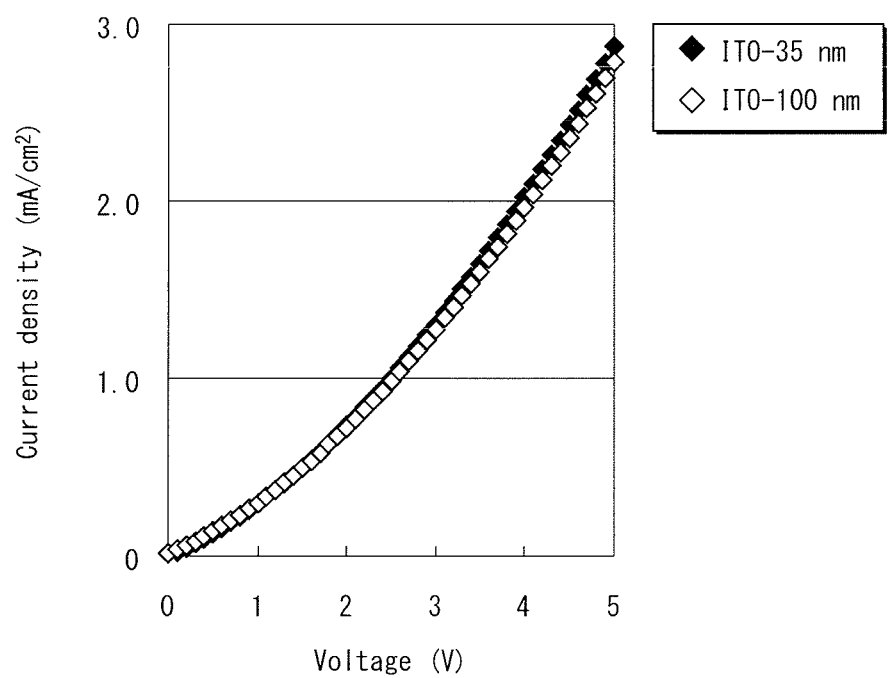
FIG. 4 shows experimental results of relations between voltage and current density.

FIG. 4 shows experimental results on relations between voltage and current density. The horizontal axis is the current density (mA/cm²), and the vertical axis is the voltage applied (V). Referring to the experimental results, a relation between voltage and current density of Sample 1 is equivalent to a relation between voltage and current density of Sample 2. Specifically, when a voltage of 3 V is applied, the current density in Sample 1 is 1.30 mA/cm², and the current density in Sample 2 is 1.28 mA/cm². When a voltage of 5 V is applied, the current density in Sample 1 is 2.87 mA/cm², and the current density in Sample 2 is 2.79 mA/cm².

The experimental results show that it suffices to form, on an electron transport layer, an approximately 35 nm thick cathode having a high film stress by magnetron sputtering, in order to obtain high electron injection properties from the cathode into the electron transport layer. That is to say, a cathode is required to have a given thickness (e.g. 100 nm) in terms of a sheet resistance and designing, but it is not necessary to form the whole of the cathode by magnetron sputtering as a thin film having a high film stress. As long as a portion of the cathode having a thickness of approximately 35 nm and being in contact with the electron transport layer is formed by magnetron sputtering as a thin film having a high film stress, high electron injection properties from the cathode into the electron transport layer can be obtained.

Evaluation of device performance was then conducted with respect to organic electroluminescent elements manufactured by forming ITO films on respective electron transport layers by magnetron sputtering under different ambient gas pressure conditions. Specifically, a light-emitting efficiency, a drive voltage, and a luminance-halved lifetime were measured. The luminance-halved lifetime refers to a time until initial luminance of an organic electroluminescent element is halved when a predetermined voltage is continuously applied to the organic electroluminescent element for light emission. The measurement results are shown in FIGS. 5, 6, and 7.

Conditions during film formation by magnetron sputtering indicate: a distance between a target and a film-forming substrate of 80 nm; a power density of 9.0 W/cm²; an Ar gas flow of 200 sccm; an $O_2$ gas flow of 10 sccm; a frequency of 250 kHz; and a duty ratio of 72.5%, and the ITO films were formed under ambient gas pressure conditions of 0.6 Pa, 1.0 Pa, 1.4 Pa, and 1.8 Pa. The gas flow herein refers to a flow of gas supplied to a sputtering chamber. The frequency refers to a pulse frequency of current applied to the target. The duty ratio refers to a positive bias time per pulse cycle.

Figure 5:
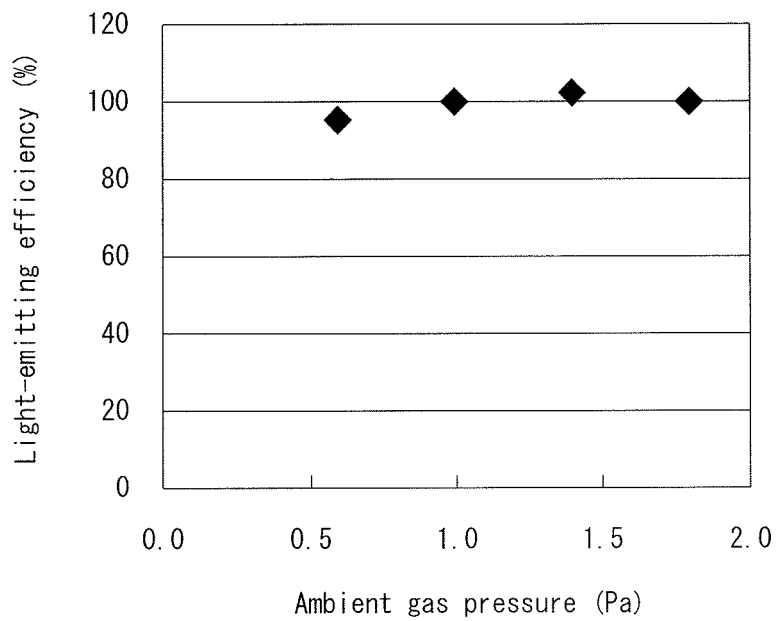
FIG. 5 shows light-emitting efficiencies of organic electroluminescent elements manufactured by forming ITO films on electron transport layers.

FIG. 5 shows light-emitting efficiencies of the organic electroluminescent elements manufactured by forming the ITO films on respective electron transport layers by magnetron sputtering. The light-emitting efficiency shown on the vertical axis is a light-emitting efficiency relative to a light-emitting efficiency of an organic electroluminescent element manufactured by forming a cathode under an ambient gas pressure condition of 1 Pa. FIG. 5 shows that, when the ITO films are formed under any of the above-mentioned ambient gas pressure conditions, almost equivalent light-emitting efficiencies are obtained.

Figure 6:
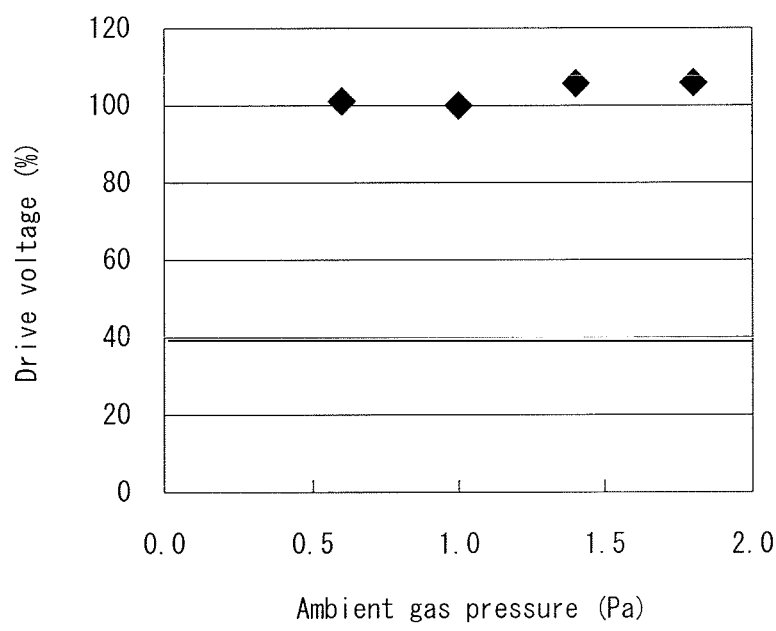
FIG. 6 shows drive voltages of the organic electroluminescent elements manufactured by forming the ITO films on the electron transport layers.
Figure 7:
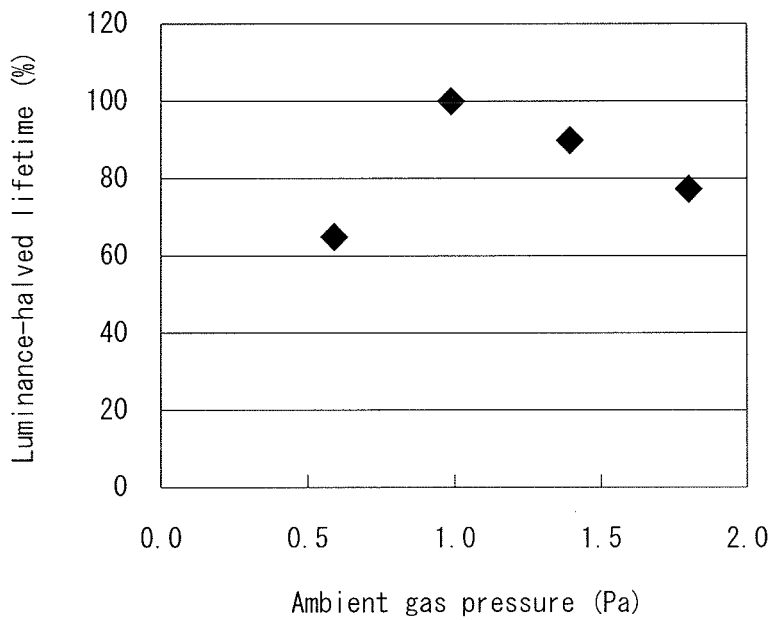
FIG. 7 shows luminance-halved lifetimes of the organic electroluminescent elements manufactured by forming the ITO films on the electron transport layers.

FIG. 6 shows drive voltages of the organic electroluminescent elements manufactured by forming the ITO films on the respective electron transport layers by magnetron sputtering. The drive voltage shown on the vertical axis is a drive voltage relative to a drive voltage of the organic electroluminescent element manufactured by forming the cathode under the ambient gas pressure condition of 1 Pa. FIG. 6 shows that, when the ITO films are formed under any of the above-mentioned ambient gas pressure conditions, drive voltages are almost equivalent.

FIG. 7 shows luminance-halved lifetimes of the organic electroluminescent elements manufactured by forming the ITO films on the respective electron transport layers by magnetron sputtering. The lifetime shown on the vertical axis is a luminance-halved lifetime relative to a luminance-halved lifetime of the organic electroluminescent element manufactured by forming the cathode under the ambient gas pressure condition of 1 Pa.

As shown in FIG. 7, the highest the lifetime property is obtained when the ITO film is formed under the ambient gas pressure condition of 1 Pa. FIG. 7 also shows that, when the ambient gas pressure is higher than 1 Pa, the luminance-halved lifetime decreases with an increase in ambient gas pressure.

Measured next were sheet resistances of the organic electroluminescent elements manufactured by forming ITO films on respective electron transport layers by magnetron sputtering under different conditions relating to the power density, the ambient gas pressure, and the oxygen flow. Conditions during film formation by magnetron sputtering indicate: a distance between the target and the film-forming substrate of 80 nm; an Ar gas flow of 200 sccm; an $O_2$ gas flow of 10 sccm; a frequency of 250 kHz; and a duty ratio of 72.5%, and the ITO films were formed under power density conditions of 4.5 W/cm² and 9.0 W/cm², and under ambient gas pressure conditions of 0.6 Pa, 1.0 Pa, 1.4 Pa, and 1.8 Pa.

Figure 8:
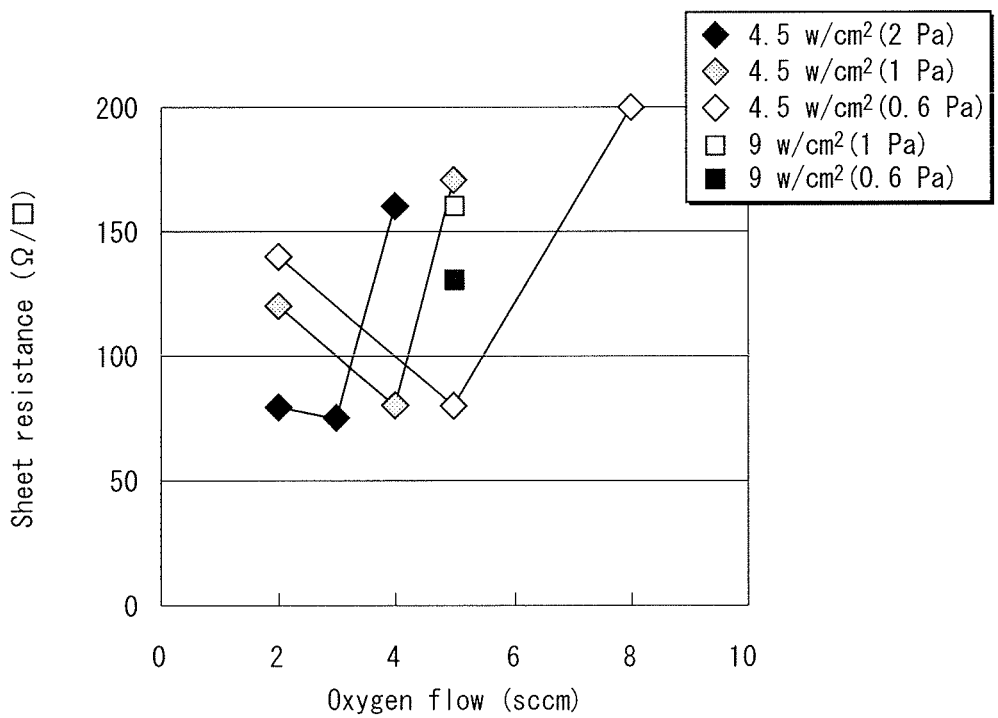
FIG. 8 shows sheet resistances of the organic electroluminescent elements manufactured by forming the ITO films on the electron transport layers.

FIG. 8 shows sheet resistances of the organic electroluminescent elements manufactured by forming the ITO films on the respective electron transport layers by magnetron sputtering. FIG. 8 shows that a value of the sheet resistance of the ITO film varies depending on the power density and the oxygen flow.

Light transmittances of the ITO films formed by magnetron sputtering under different conditions relating to the power density, the ambient gas pressure, and the oxygen flow were measured next. Conditions during film formation by magnetron sputtering are the same as those in the experiment shown in FIG. 8.

Figure 9:
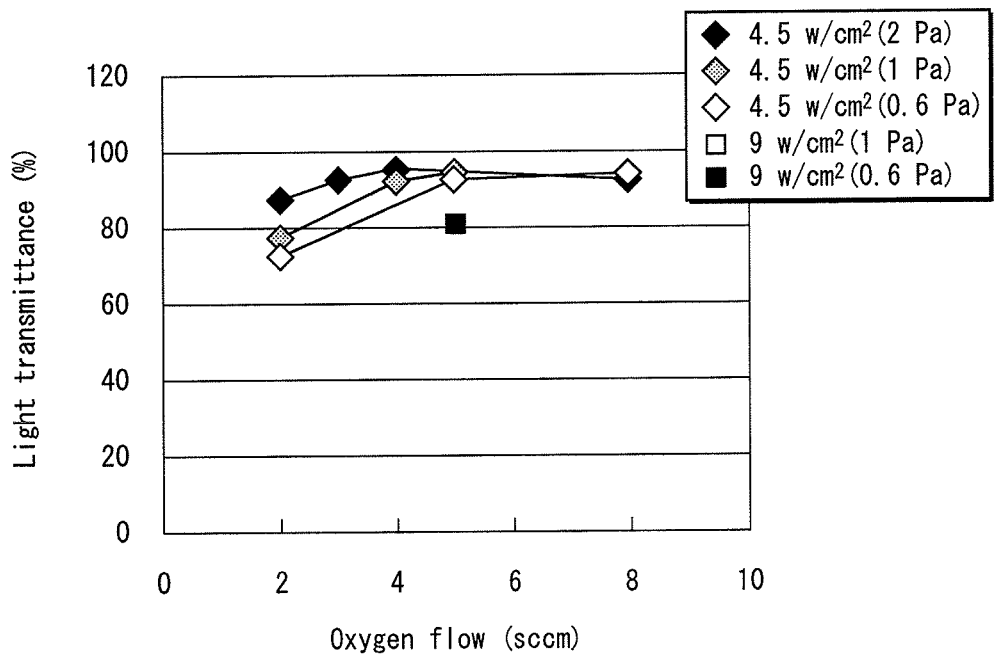
FIG. 9 shows transmittances of ITO films formed by magnetron sputtering with respect to light having a wavelength of 450 nm.

FIG. 9 shows transmittances of the ITO films formed by magnetron sputtering with respect to light having a wavelength of 450 nm. FIG. 9 shows that a light transmittance of roughly 80% or higher can be obtained under any of the above-mentioned conditions.

Film stresses of 100 nm thick ITO films formed by magnetron sputtering under different conditions relating to the power density, the ambient gas pressure, and the oxygen flow were measured next. Conditions during film formation by magnetron sputtering are the same as those in the experiment shown in FIG. 8.

Figure 10:
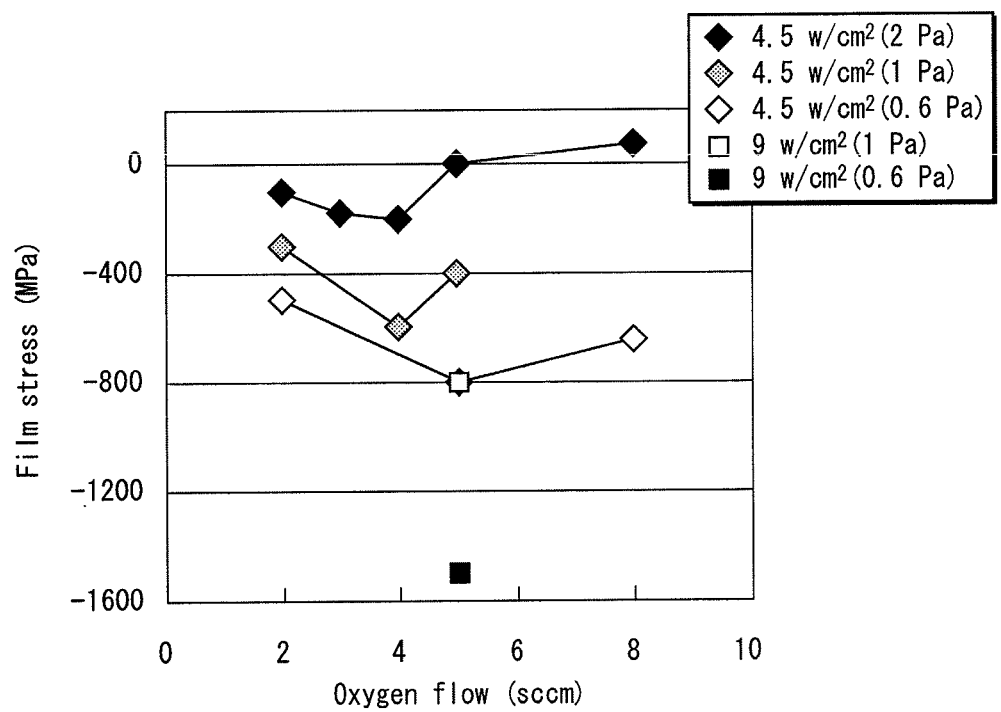
FIG. 10 shows film stresses of the ITO films formed by magnetron sputtering.

FIG. 10 shows film stresses of the ITO films formed by magnetron sputtering. The horizontal axis is the $O_2$ gas flow (sccm), and the vertical axis is the film stress (MPa). A thin film formed by magnetron sputtering exhibits the compressive stress, and a smaller value on the vertical axis indicates a higher film stress.

FIG. 10 shows that a film stress of an ITO film formed under a condition indicating a power density of 4.5 W/cm$^2$, an ambient gas pressure of 0.6 Pa, and an oxygen flow of 5 sccm is lower than a film stress of an ITO film formed under a condition indicating a power density of 9.0 W/cm$^2$, an ambient gas pressure of 0.6 Pa, and an oxygen flow of 5 sccm. FIG. 10 also shows that a film stress of an ITO film formed under a condition indicating a power density of 9.0 W/cm$^2$, an ambient gas pressure of 1.0 Pa, and an oxygen flow of 5 sccm is lower than a film stress of an ITO film formed under a condition indicating a power density of 9.0 W/cm$^2$, an ambient gas pressure of 0.6 Pa, and an oxygen flow of 5 sccm.

This shows that the film stress of the ITO film decreases with a decrease in power density in magnetron sputtering, and with an increase in ambient gas pressure in magnetron sputtering. Presumably, this is because energy of sputtered particles colliding with the growth face of the film is reduced by decreasing the power density and by raising the ambient gas pressure, leading to a reduction in film stress.

The film stress in the case of stacking two ITO films was examined next. Specifically, film stresses were examined with respect to the following three samples: [a] a 100 nm thick ITO electrode formed by facing target sputtering (Sample A); [b] a 100 nm thick ITO electrode formed by magnetron sputtering (Sample B); and [c] a stack of a 10 nm thick ITO film formed by facing target sputtering and a 90 nm thick ITO film formed by magnetron sputtering on the 10 nm thick ITO film (Sample C).

Conditions during film formation by facing target sputtering in Sample A indicate: a power of 2.5 kW; an ambient gas pressure of 1.0 Pa; and an Ar gas flow of 200 sccm, and ITO electrodes were formed under different $O_2$ gas flow conditions, and then film stresses were measured.

Conditions during film formation by magnetron sputtering in Sample B indicate: a power density of 4.5 W/cm$^2$; an ambient gas pressure of 0.6 Pa; and an Ar gas flow of 200 sccm, and ITO electrodes were formed under different $O_2$ gas flow conditions, and then film stresses were measured.

Conditions during film formation by facing target sputtering in Sample C indicate: a power of 2.5 kW; an ambient gas pressure of 1.0 Pa; an Ar gas flow of 200 sccm; and an $O_2$ gas flow of 1 sccm. Conditions during film formation by magnetron sputtering in Sample C indicate: a power density of 4.5 W/cm$^2$; an ambient gas pressure of 0.6 Pa; an Ar gas flow of 200 sccm; and an $O_2$ gas flow of 5 sccm.

Figure 11:
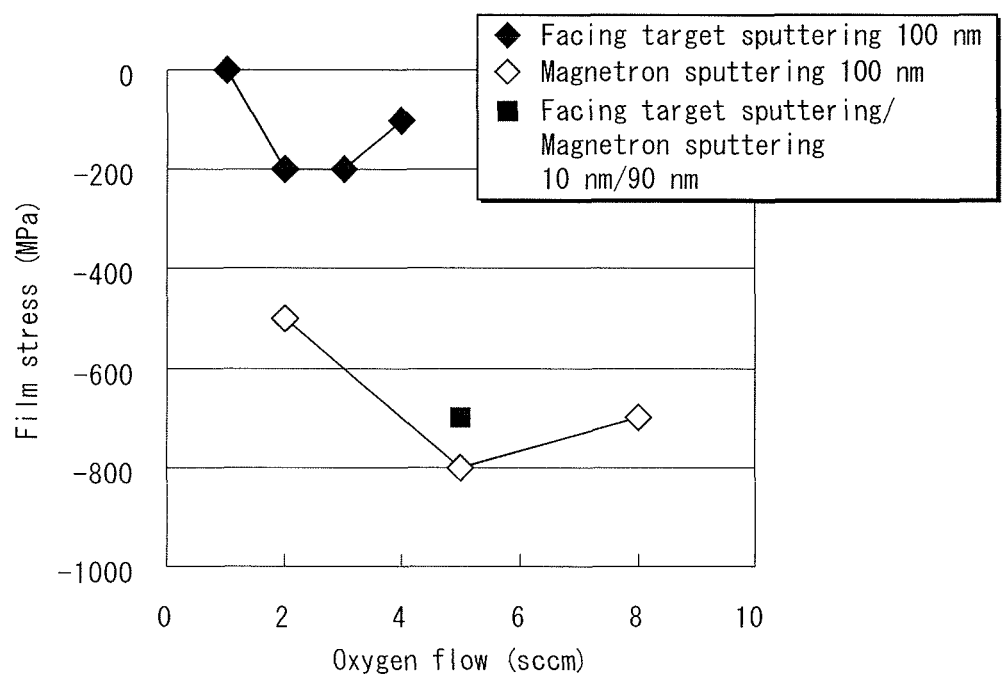
FIG. 11 shows a film stresses of a stack composed of two ITO films.

FIG. 11 shows measurement results of the film stresses. The horizontal axis is the $O_2$ gas flow (sccm), and the vertical axis is the film stress (MPa). In order for easy comparison of Sample C with Sample B, the result of Sample C is plotted so as to correspond to the $O_2$ gas flow of 5 sccm on the horizontal axis, which is the condition during film formation by magnetron sputtering.

The experimental results show that the film stress is lower in the case where the 10 nm thick ITO film is formed by facing target sputtering, and the 90 nm thick ITO film is formed by magnetron sputtering on the 10 nm thick ITO film, than in the case where the 100 nm thick ITO electrode is formed only by magnetron sputtering. That is to say, it is considered that a film stress of the entire ITO electrode is mitigated by stacking an ITO film having a low film stress.

Figure 12:
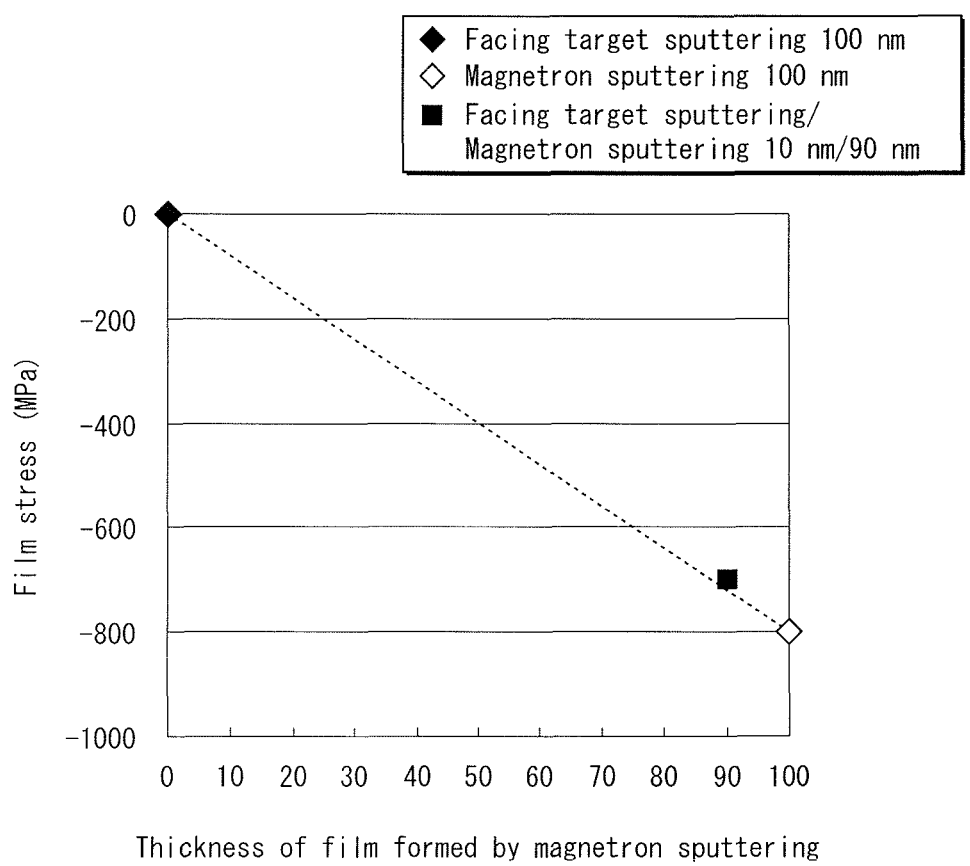
FIG. 12 shows a relation between the thickness and a film stress of an ITO electrode formed by magnetron sputtering.

FIG. 12 shows a relation between the thickness of the ITO electrode formed by magnetron sputtering and the film stress of the ITO electrode. The horizontal axis is the thickness (nm) of an ITO film formed by magnetron sputtering under a condition indicating a power density of 4.5 W/cm$^2$ and an ambient gas pressure of 0.6 Pa, and the vertical axis is the film stress (MPa) of the ITO electrode. A black rhombus as plotted corresponds to Sample A under an $O_2$ gas flow condition of 1 sccm shown in FIG. 11. A white rhombus as plotted corresponds to Sample B under an $O_2$ gas flow condition of 5 sccm shown in FIG. 11. A black square as plotted corresponds to Sample C shown in FIG. 11.

The experimental results shown in FIG. 11 show that a film stress of the entire ITO electrode is mitigated by stacking an ITO film having a low film stress on an ITO film having a high film stress. It is thus considered, from the black rhombus, the white rhombus, and the black square as plotted, that, when a thin film having no film stress is stacked on an ITO film formed by magnetron sputtering under the condition indicating a power density of 4.5 W/cm$^2$ and an ambient gas pressure of 0.6 Pa, the relation between the thickness of the ITO film formed by magnetron sputtering under the condition indicating a power density of 4.5 W/cm$^2$ and an ambient gas pressure of 0.6 Pa and the film stress of the ITO electrode is as shown by a dotted line in FIG. 12.

That is to say, it is considered that, when the ITO film having a low film stress is formed on the ITO film having a high film stress, the film stress of the entire ITO electrode decreases with decreasing ratio of the thickness of the ITO film having a high film stress and with increasing ratio of the thickness of the ITO film having a low film stress to the thickness of the entire ITO electrode.

The above-described results shown in FIGS. 10, 11, and 12 show that an ITO film having a low film stress can be formed by reducing the power density, and by raising the ambient gas pressure in magnetron sputtering, and that the film stress per unit thickness of the entire cathode can be decreased by stacking the ITO film having a low film stress on an ITO film having a high film stress.

Figure 13B:
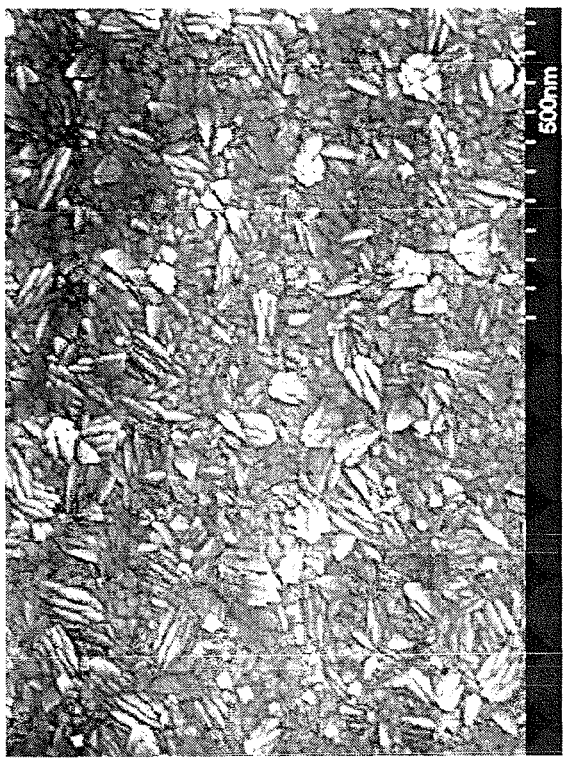
FIGS. 13A and 13B show SEM photographs of ITO films formed by facing target sputtering and magnetron sputtering, respectively.
Figure 13A:
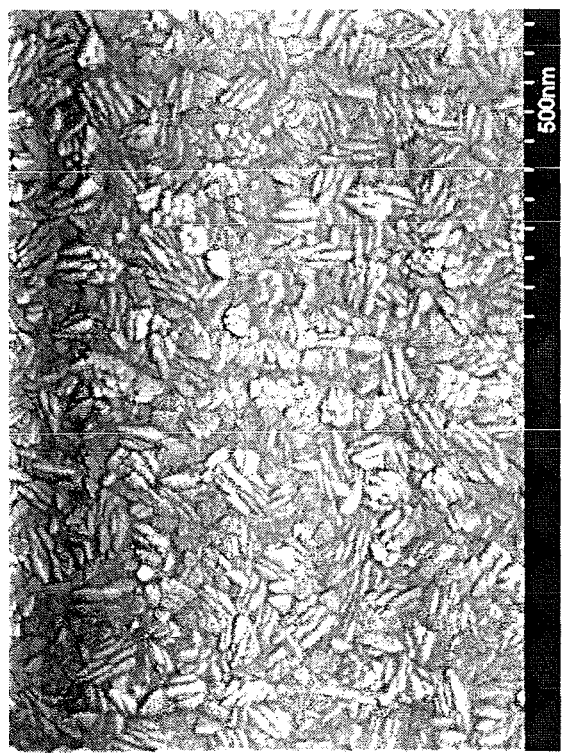

FIGS. 13A and 13B show SEM photographs of ITO films formed by facing target sputtering and magnetron sputtering, respectively. The SEM photograph shown in FIG. 13A shows an ITO film formed by facing target sputtering under a condition indicating: a power of 2.5 kW; an ambient gas pressure of 0.2 Pa; an Ar gas flow of 200 sccm; an $O_2$ gas flow of 1.5 sccm; a frequency of 250 kHz; and a duty ratio of 72.5%. The SEM photograph shown in FIG. 13B shows an ITO film formed by magnetron sputtering under a condition indicating: a power of 2.5 kW; an ambient gas pressure of 2.0 Pa; an Ar gas flow of 200 sccm; an $O_2$ gas flow of 10 sccm; a frequency of 250 kHz; and a duty ratio of 72.5%.

Referring to the photographs shown in FIGS. 13A and 13B, it is observed that the ITO film formed by magnetron sputtering so as to have a high film stress has a surface profile that is approximately equivalent to a surface profile of the ITO film formed by facing target sputtering.

The thickness of the cathode included in the organic electroluminescent element according to one embodiment of the present invention is, for example, 5 nm to 300 nm inclusive.

The sheet resistance of the cathode included in the organic electroluminescent element according to one embodiment of the present invention is, for example, 1000 [Ω/□].

The light transmittance of the cathode included in the organic electroluminescent element according to one embodiment of the present invention is, for example, 80% to 95% inclusive.

The distance between the target and the film-forming substrate in the primary film-formation step and the secondary film-formation step of cathode formation according to one embodiment of the present invention is, for example, 50 mm to 80 mm inclusive.

The Ar gas flow in the primary film-formation step and the secondary film-formation step of cathode formation according to one embodiment of the present invention is, for example, 100 sccm to 500 sccm inclusive.

The $O_2$ gas flow in the primary film-formation step of cathode formation according to one embodiment of the present invention is, for example, 5 sccm to 25 sccm inclusive.

The $O_2$ gas flow in the secondary film-formation step of cathode formation according to one embodiment of the present invention is, for example, 0 sccm to 50 sccm inclusive.

The ambient gas pressure in the secondary film-formation step of cathode formation according to one embodiment of the present invention is, for example, 1.0 Pa to 2.0 Pa inclusive.

[Magnetron Sputtering in High Energy Process]

In the primary film-formation step of cathode formation in the method for manufacturing the organic electroluminescent element according to one embodiment of the present invention, it is preferred to form the first cathode layer 102 by magnetron sputtering in a high energy process. More specifically, it is preferred to form the first cathode layer 102 by magnetron sputtering with a power density of between 4.5 W/cm$^2$ and 9.0 W/cm$^2$ inclusive. The following describes magnetron sputtering in a high energy process.

In a conventional process of forming a cathode, a method such as vapor deposition and facing target sputtering is used to prevent degradation of properties, such as a drive voltage and an element lifetime, of the organic electroluminescent element caused by the damage to the organic functional layer as the underlayer.

Especially in a top-emission type organic electroluminescent element, in which it is necessary to use a light-transmissive material such as indium tin oxide (ITO) and indium zinc oxide (IZO) for a cathode, sputtering in a high energy process is avoided in order to prevent degradation of properties, such as a drive voltage and an element lifetime, of the organic electroluminescent element caused by the damage to the organic functional layer as the underlayer.

In film formation by using the conventional method such as vapor deposition and facing target sputtering, however, energy of atoms or molecules of a target adhering to an organic functional layer is low, and thus adhesion between the upper electrode and the organic functional layer as an underlayer is low. A barrier against injection of electrons or holes between the organic functional layer and the electrode is thus large, and an organic electroluminescent element as manufactured cannot have sufficient properties in terms of a drive voltage and an element lifetime.

To address the above-mentioned problem, the inventors made an assessment of damage to an electron transport layer caused by formation of an ITO film, and examined the possibility of canceling out, by increasing adhesion between the ITO electrode and the electron transport layer, the damage to the electron transport layer caused by forming the ITO film by sputtering in a high energy process.

As a result of the examination, the inventors found that adhesion between the cathode and the organic functional layer can be increased by forming the ITO film by magnetron sputtering in a high energy process in which the amount of ion incident on a film-forming substrate is large, and that it is possible to manufacture a high-efficient, long-lived organic electroluminescent element having high electron injection properties from the cathode into the organic functional layer.

Formation of the cathode by magnetron sputtering in a high energy process is described below in more detail, with reference to results of experiments that the inventors conducted.

First, the inventors formed ITO films on respective electron transport layers by plasma deposition, magnetron sputtering, and facing target sputtering, and evaluated the ITO films as formed. Specifically, the inventors evaluated the ITO films in terms of a grain diameter, a work function, and a sheet resistance.

The power is 5.4 kW in magnetron sputtering, and 2.5 kW in facing target sputtering. The power density, which refers to a power per unit target area, in magnetron sputtering is 9.0 W/cm$^2$.

The ambient gas pressure is 0.6 Pa in magnetron sputtering and in facing target sputtering, and 0.7 Pa in plasma deposition.

Figure 14A:
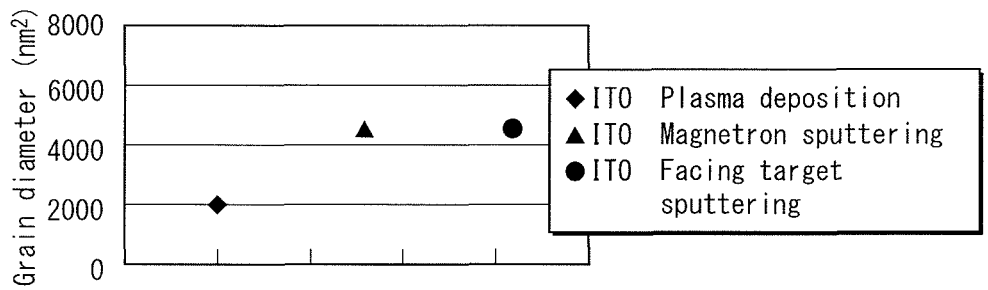
FIGS. 14A-14C show evaluation results of ITO films formed by different methods.
Figure 14B:
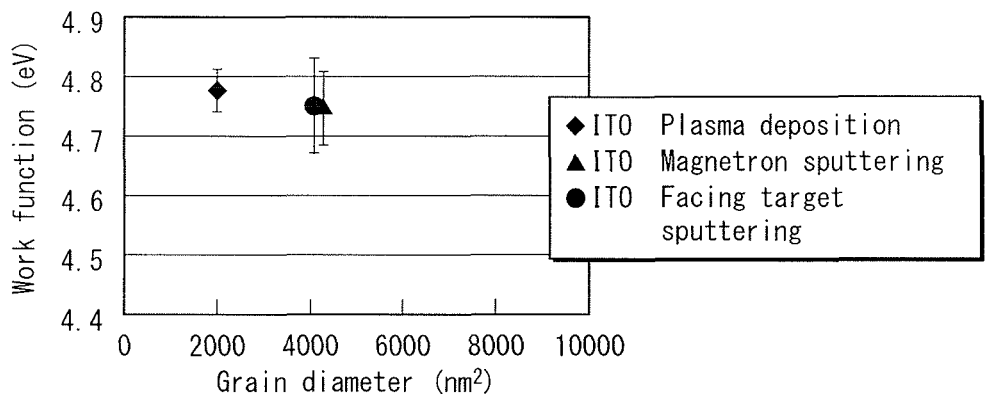
Figure 14C:
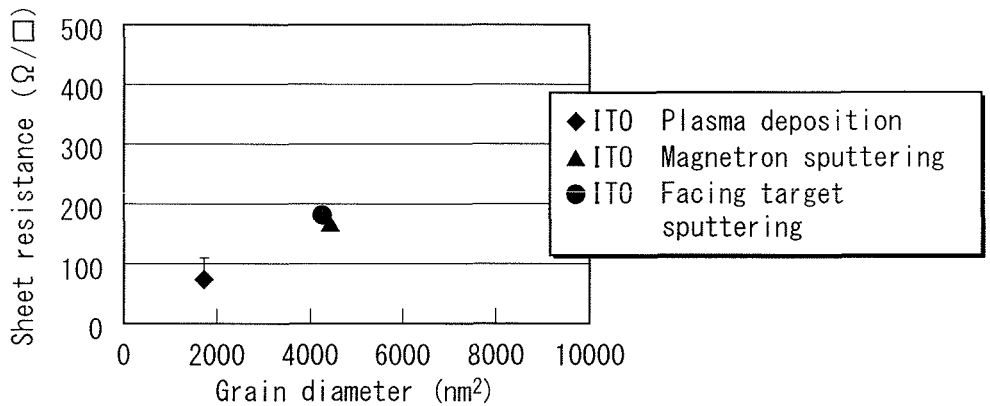

FIGS. 14A-14C show evaluation results of ITO films formed by the different methods. FIGS. 14A, 14B, and 14C respectively show grain diameters obtained by observation under a scanning electron microscope (SEM), work functions, and sheet resistances of the ITO films.

Referring to FIG. 14A, a grain diameter of the ITO film formed by magnetron sputtering is equivalent to that of the ITO film formed by facing target sputtering. A grain diameter of the ITO film formed by plasma deposition is smaller than the grain diameter of the ITO film formed by magnetron sputtering and the grain diameter of the ITO film formed by facing target sputtering.

Referring to FIG. 14B, a work function of the ITO film formed by plasma deposition, a work function of the ITO film formed by magnetron sputtering, and a work function of the ITO film formed by facing target sputtering are equivalent.

Referring to FIG. 14C, the sheet resistance increases in proportion to the grain diameter.

As a result of thus evaluating the ITO films in terms of the grain diameter, the work function, and the sheet resistance, there is no clear difference in work function among the ITO films formed by the different methods.

Figure 15A:
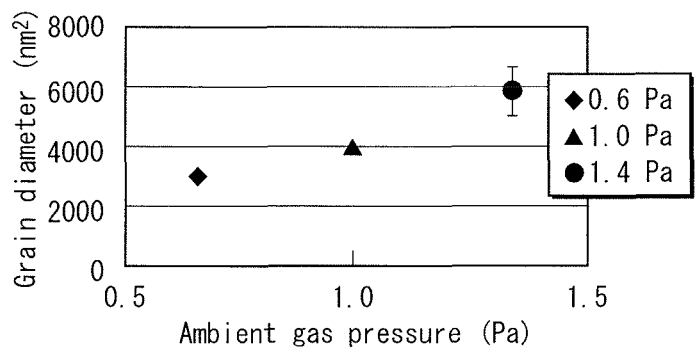
FIGS. 15A-15C show evaluation results of ITO films formed under different ambient gas pressure conditions.
Figure 15B:
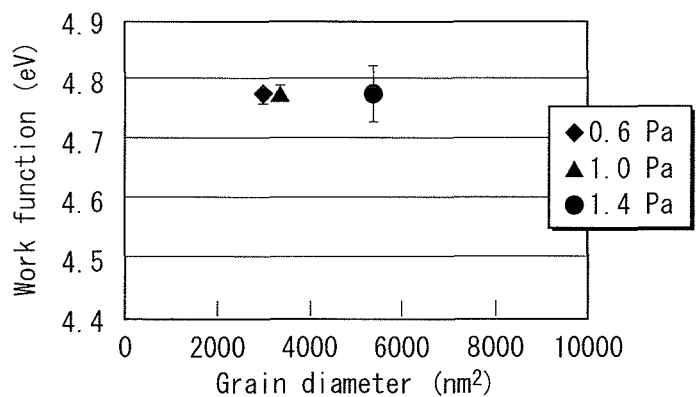
Figure 15C:
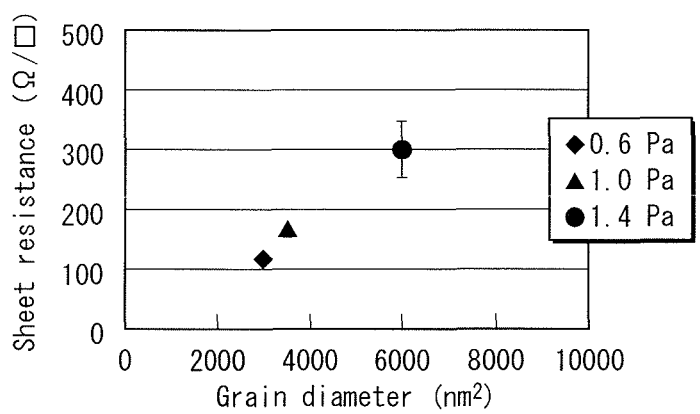

The inventors also formed ITO films on respective electron transport layers by magnetron sputtering under different ambient gas pressure conditions, and evaluated the ITO films thus formed. FIGS. 15A-15C show evaluation results of the ITO films formed under different ambient gas pressure conditions. FIGS. 15A, 15B, and 15C respectively show grain diameters obtained by observation under the SEM, work functions, and sheet resistances of the ITO films. The ITO films evaluated herein were those formed under ambient gas pressure conditions of 0.6 Pa, 1.0 Pa, and 1.4 Pa.

Referring to FIG. 15A, the grain diameter of each ITO film increases in proportion to the ambient gas pressure.

Referring to FIG. 15B, work functions of the ITO films formed under the ambient gas pressure conditions of 0.6 Pa, 1.0 Pa, and 1.4 Pa are equivalent.

Referring to FIG. 15C, the sheet resistance increases in proportion to the grain diameter.

As a result of thus evaluating the ITO films formed by magnetron sputtering under different ambient gas pressure conditions in terms of the grain diameter, the work function, and the sheet resistance, there is no clear difference in work function among the ITO films formed under different ambient gas pressure conditions.

Light transmittances of the ITO films formed by the methods and under the conditions shown in FIGS. 14A-14C and 15A-15C were measured.

Figure 16A:
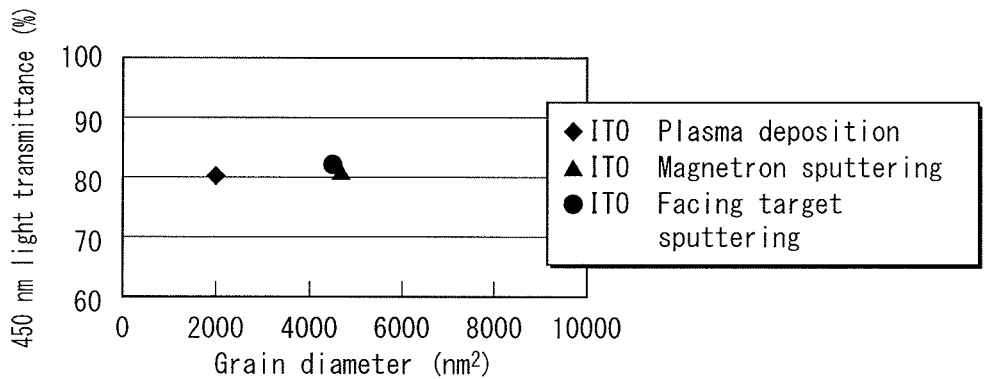
FIGS. 16A-16C show measurement results of light transmittances of ITO films formed by different methods.
Figure 16B:
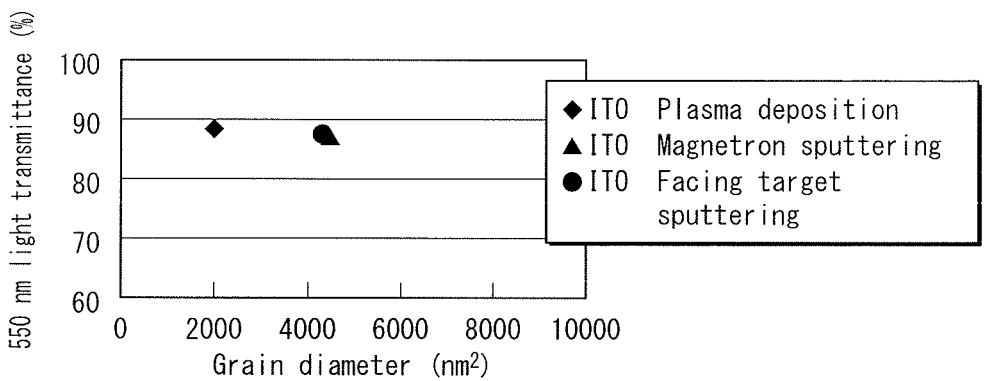
Figure 16C:
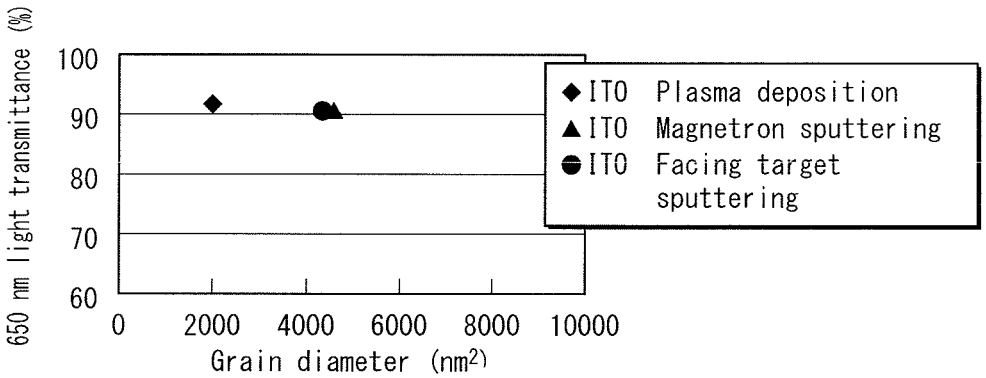

FIGS. 16A-16C show measurement results of light transmittances of ITO films formed by different methods. FIGS. 16A, 16B, and 16C show transmittances with respect to light having a wavelength of 450 nm, light having a wavelength of 550 nm, and light having a wavelength of 650 nm, respectively. Conditions during film formation by plasma deposition, magnetron sputtering, and facing target sputtering are the same as those shown in FIGS. 14A-14C.

Referring to FIGS. 16A-16C, light transmittances of the ITO films formed by the above-mentioned methods are equivalent for each wavelength.

Figure 17A:
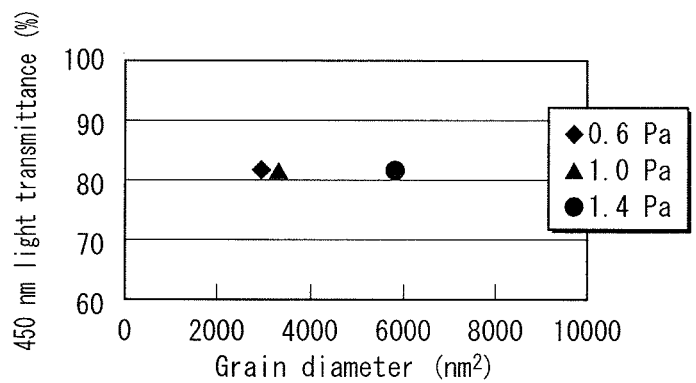
FIGS. 17A-17C show measurement results of light transmittances of ITO films formed under different ambient gas pressure conditions.
Figure 17B:
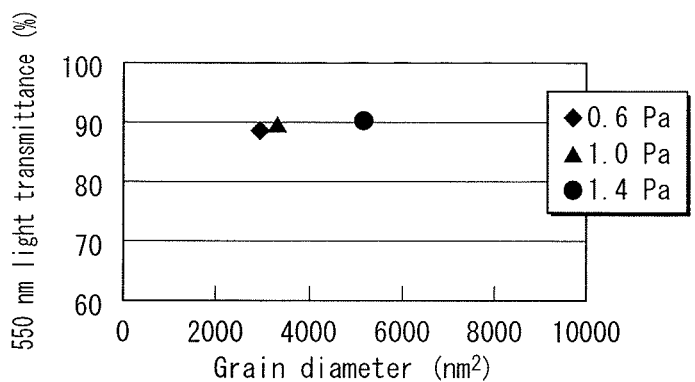
Figure 17C:
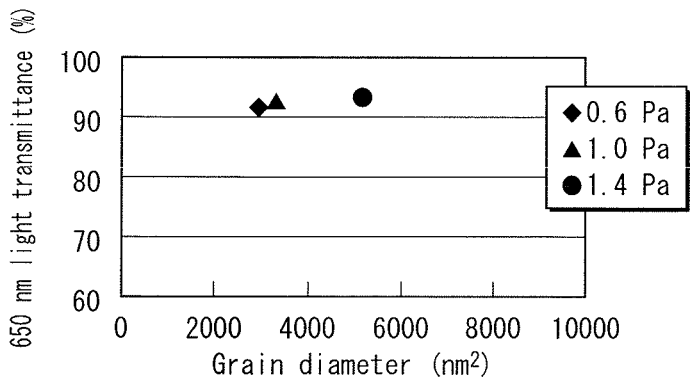

FIGS. 17A-17C show measurement results of light transmittances of ITO films formed under different ambient gas pressure conditions. FIGS. 17A, 17B, and 17C show transmittances with respect to light having a wavelength of 450 nm, light having a wavelength of 550 nm, and light having a wavelength of 650 nm, respectively. As with the conditions shown in FIGS. 15A-15C, light transmittances of the ITO films formed by magnetron sputtering under the ambient gas pressure conditions of 0.6 Pa, 1.0 Pa, and 1.4 Pa were measured.

Referring to FIGS. 17A-17C, light transmittances of the ITO films formed under different ambient gas pressure conditions are equivalent for each wavelength.

Further, an assessment of damage to an organic functional layer as the underlayer caused by forming an ITO film was made by using X-ray photoelectron spectroscopy (XPS). Specifically, in order to make the assessment of damage to the organic functional layer, 5 nm thick Alq3 (tris(8-quinolinato) aluminum) films were formed on respective glass substrates by vapor deposition, and 35 nm thick indium tin oxide (ITO) films were then formed on the respective Alq3 films by plasma gun deposition, magnetron sputtering, and facing target sputtering, respectively. The Alq3 films were then separated from the glass substrates, and XPS analysis was conducted on interfaces between the Alq3 films and the ITO films. Another sample was prepared by forming a 120 nm thick aluminum (Al) film on the Alq3 film by vapor deposition, and XPS analysis was conducted on an interface between the Alq3 film and the Al film. For comparison, XPS analysis was conducted also on the Alq3 film on which an ITO film is not formed. Alq3 is commonly used as a material for an electron transport layer included in an organic electroluminescent element.

Figure 18A:
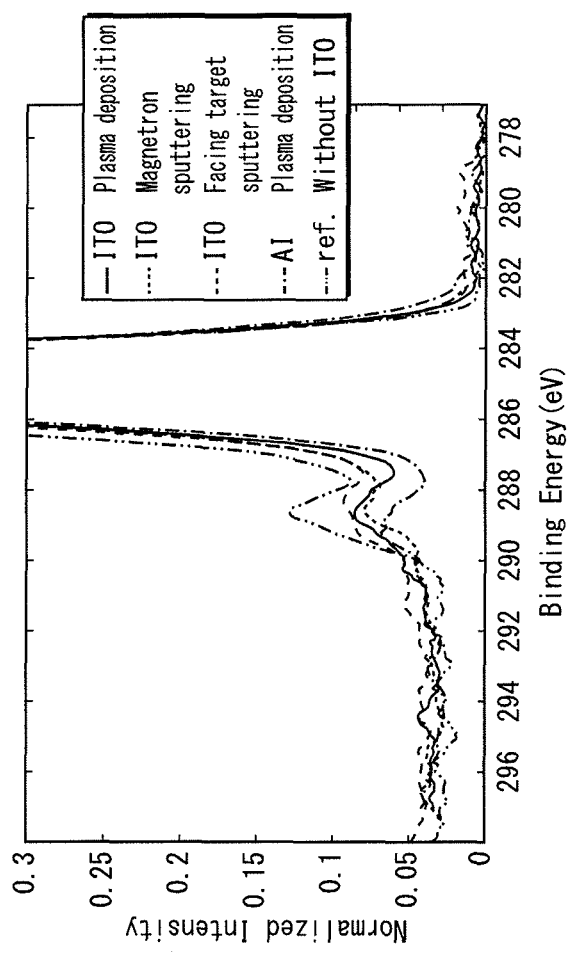
FIGS. 18A and 18B show results of XPS analysis of interfaces between Alq3 films and ITO films.
Figure 18B:
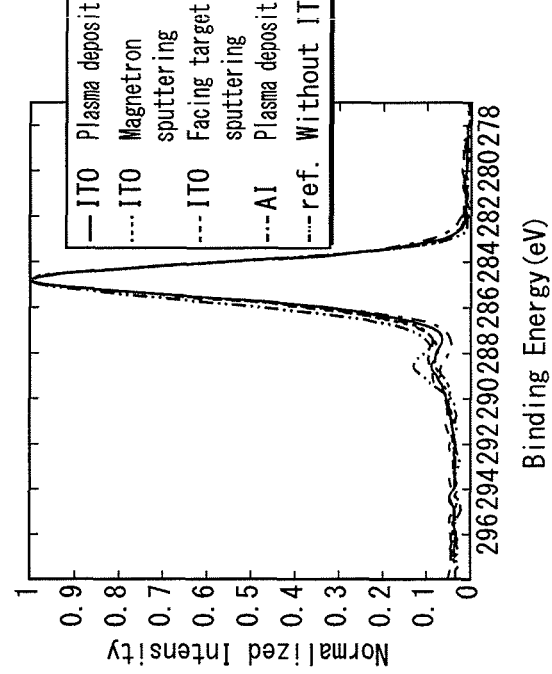

FIGS. 18A and 18B show results of XPS analysis of the interfaces between the Alq3 films and the ITO films. FIG. 18A shows results of comparison of C1s spectra. FIG. 18B is an enlarged view of the results of comparison of C1s spectra shown in FIG. 18A.

Referring to FIGS. 18A and 18B, equivalent decreases in spectrum peak were observed in the ITO films formed by plasma deposition, magnetron sputtering, facing target sputtering in the vicinity of a binding energy of 288 ev to 290 ev. Such decreases in spectrum peak were attributable to damage to the Alq3 films caused in the process of forming the ITO films, but there was no clear difference in spectra among the ITO films formed by the different methods.

By performing peak fitting of the spectra, composition ratios of the thin films so formed were calculated. Samples were: (1) an Alq3 film and a 2 nm thick ITO film formed on the Alq3 film by plasma gun deposition; (2) an Alq3 film and a 2 nm thick ITO film formed on the Alq3 film by magnetron sputtering; (3) an Alq3 film and a 2 nm thick ITO film formed on the Alq3 film by facing target sputtering; (4) an Alq3 film and a 2 nm thick aluminum (Al) film formed on the Alq3 film by vapor deposition; and (5) an Alq3 film on which an ITO film is not formed. The results are as follows.

TABLE 1

| Sample | C | N | O | Al | Si | In | Sn |
|---|---|---|---|---|---|---|---|
| Alq3 ITO plasma deposition 2 nm | 48 | 2 | 30 | — | — | 18 | 2 |
| Alq3 ITO magnetron sputtering 2 nm | 47 | 2 | 29 | — | — | 16 | 6 |
| Alq3 ITO facing target sputtering 2 nm | 43 | 2 | 31 | — | — | 17 | 6 |
| Alq3 Al plasma deposition 2 nm | 46 | 2 | 35 | 18 | — | — | — |
| Alq3 without ITO 2 nm | 35 | 2 | 50 | 3 | 10 | — | — |

(atom %)

Referring to table 1, there was no clear difference in composition ratio of atoms among the ITO films formed by different methods.

The inventors focused on the fact that there was no clear difference among the ITO films formed by different methods and under different conditions in evaluating the ITO films and the organic functional layers as shown in FIGS. 14A-14C, 15A-15C, 16A-16C, 17A-17C, 18A, 18B, and Table 1 shown above. The inventors examined the possibility of manufacturing an organic electroluminescent element having high properties, such as a drive voltage and an element lifetime, by forming an ITO layer by sputtering in a high energy process, thereby increasing adhesion between the ITO layer and the organic functional layer. Formation of the ITO layer by sputtering in a high energy process is avoided in conventional technology to prevent degradation of properties, such as a drive voltage and element lifetime, of the organic electroluminescent element.

In forming the ITO layer, magnetron sputtering or facing target sputtering is used. The inventors examined which one of magnetron sputtering and facing target sputtering is suitable as a method for forming an electrode on an organic functional layer.

First, ion currents, which indicate the amount of ion of a sputtering gas that a film-forming substrate is irradiated with, and energy of the ion of the sputtering gas in magnetron sputtering and facing target sputtering were measured by plasma diagnosis using a probe method. The plasma diagnosis using the probe method refers to technique of measuring plasma characteristics by inserting a needle-like electrode (probe) into plasma, and measuring currents flowing through the probe.

FIG. 19 shows measurement results of the plasma characteristics. Details of the measurement results of the plasma characteristics are shown in the following table.

TABLE 2

| method | process condition | dynamic rate (Åm/min.) | dynamic rate (nm · m/sec.) | Ar ion energy (eV) | $O_2$ ion energy (eV) | ion current (mA/cm$^2$) | ion current density per unit rate |
|---|---|---|---|---|---|---|---|
| magnetron sputtering | standard | 911.92 | 1.519866667 | 99.2 | 133.26 | 0.42 | 0.27634 |
| | low duty | 901.1 | 1.501833333 | 125 | 201.73 | 0.53 | 0.35290 |
| | low frequency | 985.11 | 1.64185 | 93.8 | 124.48 | 0.48 | 0.29235 |
| | low pressure | 967.15 | 1.611916667 | 100.3 | 135.76 | 0.41 | 0.25436 |
| | oxygen flow UP | 944.76 | 1.5746 | 100.4 | 132.09 | 0.47 | 0.29849 |
| facing target sputtering | standard | 76.16 | 0.131933333 | 84.61 | 124.19 | 0.01 | 0.07580 |
| | low duty | 68.15 | 0.113583333 | 81.39 | 134.47 | 0.01 | 0.08804 |
| | high frequency | 76.09 | 0.126816667 | 71.61 | 105.99 | 0.01 | 0.07885 |
| | low pressure | 81.22 | 0.135366667 | 96.39 | 141.28 | 0.01 | 0.07387 |
| | oxygen flow UP | 75.55 | 0.125916667 | 84.87 | 124.78 | 0.01 | 0.07942 |

The plasma characteristics on a film-forming substrate were measured herein by inserting a probe into a position where the film-forming substrate exists. The horizontal axis is energy of collision of Ar ion (Ar$^+$ ion energy) with the film-forming substrate. The vertical axis is ion current per unit dynamic rate. The ion current refers to a value of current generated when plasma flows into the probe. The ion current per unit dynamic rate on the vertical axis of FIG. 19 refers to quantified ion incident on the film-forming substrate, which is obtained by dividing the ion current by a dynamic rate (a film formation speed (Åm/min) when the film-forming substrate passes under the target at a transport speed of 1 m/min).

Details of the conditions during film formation are described below.

lent, but the ion current density per unit dynamic rate in magnetron sputtering under the standard condition is approximately three times higher than that in facing target sputtering under the low pressure condition. In this case, energy accumulated on the film-forming substrate in magnetron sputtering under the standard condition is approximately three times greater than that in facing target sputtering under the low pressure condition.

Ar ion of a sputtering gas incident on the film-forming substrate provides sputtered atoms adhering to the film-forming substrate with kinetic energy. This causes the sputtered atoms to more firmly adhere to the organic functional layer, and be accumulated on the organic functional layer. As a result, a dense thin firm can be formed.

TABLE 3

| method | condition | distance between target and film-forming substrate [mm] | power [kW] | ambient gas pressure [Pa] | gas flow [sccm] Ar | $O_2$ | $H_2O$ | frequency [kHz] | duty ratio [%] |
|---|---|---|---|---|---|---|---|---|---|
| plasma deposition | standard | 800 | 30 | 0.7 | 300 | 35 | 5 | | |
| magnetron sputtering | standard | 80 | 5.4 | 0.6 | 200 | 10 | | 250 | 72.5 |
| | low duty | | | 0.6 | 200 | 10 | | 250 | 60 |
| | low frequency | | | 0.6 | 200 | 10 | | 100 | 73 |
| | low pressure | | | 0.5 | 100 | 6 | | 250 | 72.5 |
| | oxygen flow UP | | | 0.6 | 200 | 15 | | 250 | 72.5 |
| facing target sputtering | standard | 120 | 2.5 | 0.6 | 200 | 1.5 | | 250 | 72.5 |
| | low duty | | | 0.6 | 200 | 1.5 | | 250 | 60 |
| | high frequency | | | 0.6 | 200 | 1.5 | | 350 | 72 |
| | low pressure | | | 0.2 | 100 | 2.3 | | 250 | 72.5 |
| | oxygen flow UP | | | 0.6 | 200 | 3 | | 250 | 72.5 |

In Table 3 shown above, the power is 5.4 kW in magnetron sputtering, and 2.5 kW in facing target sputtering. The power density, which refers to a power per unit target area, in magnetron sputtering is 9.0 W/cm$^2$.

The gas flow refers to a flow of gas supplied to a sputtering chamber. The frequency refers to a pulse frequency of current applied to the target. The duty ratio refers to a positive bias time per pulse cycle.

Referring to FIG. 19, the ion current density per unit dynamic rate, which indicates the amount of ion incident on the film-forming substrate, is higher in magnetron sputtering than in facing target sputtering under any of the conditions during film formation. Specifically, the ion current density per unit dynamic rate in magnetron sputtering is in a range of 0.2 mA/cm$^2$ to 0.4 mA/cm$^2$ inclusive.

For example, when facing target sputtering under a low pressure condition is compared with magnetron sputtering under a standard condition, the Ar$^+$ ion energies are equiva- The experimental results show that it is preferred that the ion current density per unit dynamic rate be in a range of 0.2 mA/cm$^2$ to 0.4 mA/cm$^2$ inclusive when the first cathode layer 102 is formed in the method for manufacturing the organic electroluminescent element according to one embodiment of the present invention.

In the method for manufacturing the organic electroluminescent element according to one embodiment of the present invention, the inventors focused on the effects of the ion of the sputtering gas incident on the film-forming substrate on adhesion between the ITO layer and the organic functional layer, and focused more on magnetron sputtering, which has a greater energy accumulated on the film-forming substrate than facing target sputtering, rather than on facing target sputtering.

The inventors further formed ITO films by facing target sputtering and magnetron sputtering under different conditions, and checked differences in profile of surfaces of the ITO films by observing the profiles of the surfaces of the ITO films under the scanning electron microscope (SEM).

FIGS. 20A-20F show SEM photographs of the ITO films formed by facing target sputtering. The SEM photographs of FIGS. 20A, 20B, 20C, 20D, and 20F show ITO films formed under the conditions shown in Table 2. The SEM photograph of FIG. 20E shows an ITO film formed under the standard condition shown in Table 2 except that a condition indicating a power is changed so as to indicate a power of 1.25 kw, which is half of a power of 2.5 kw.

Referring to FIGS. 20A-20F, carcass (agglomerate) particles were observed in facing target sputtering under conditions other than the standard condition.

FIGS. 21A-21F show SEM photographs of ITO films formed by magnetron sputtering. The SEM photographs of FIGS. 21A, 21B, 21C, 21D, and 21F show ITO films formed under the conditions shown in Table 2. The SEM photograph of FIG. 21E shows an ITO film formed under the standard condition shown in Table 2 except that a condition indicating a power is changed so as to indicate a power of 2.7 kw, which is half of a power of 5.4 kw.

Referring to FIGS. 21A-21F, in magnetron sputtering, substructures in which grains are combined one another were observed, and it was found that a dense thin film was formed under each of the conditions.

Crystallinity of the ITO films formed by magnetron sputtering and facing target sputtering was also analyzed by X-ray diffraction.

Figure 22:
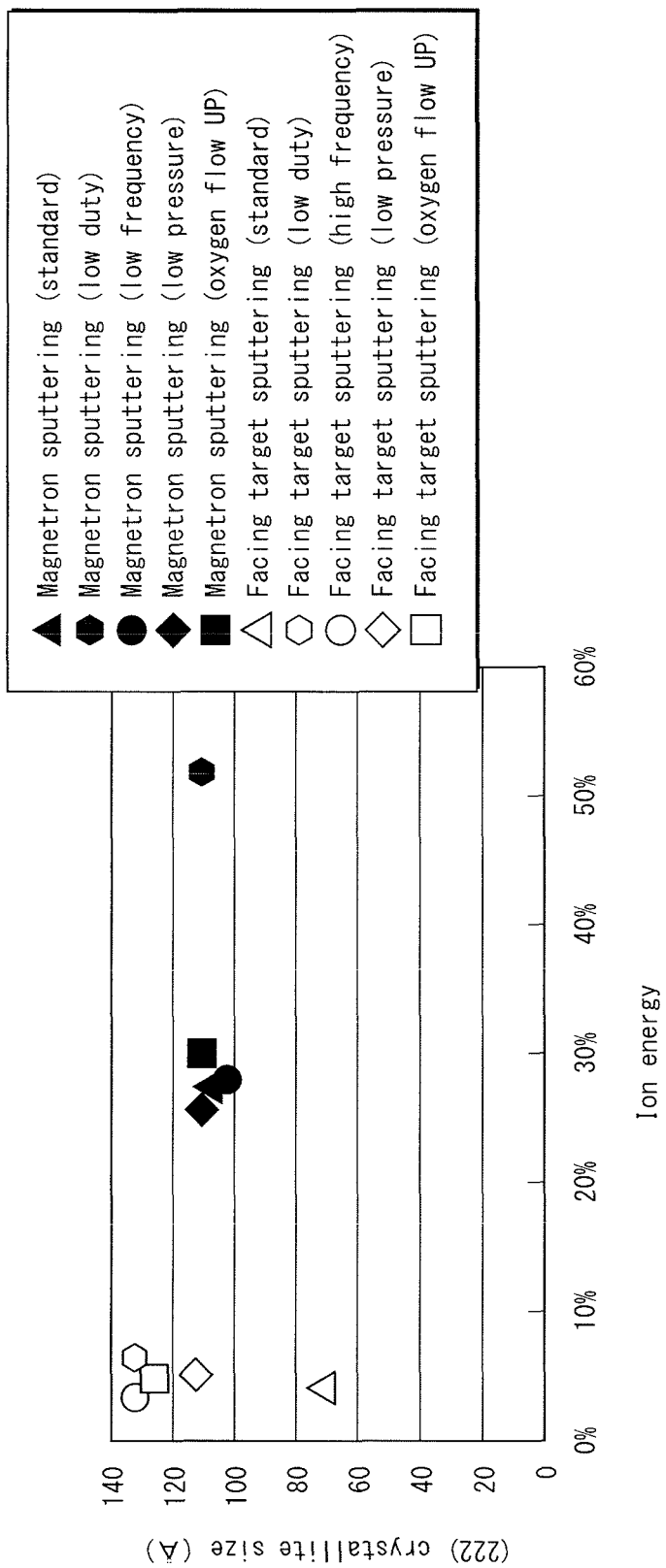
FIG. 22 shows measurement results of crystal sizes of ITO films.

FIG. 22 shows measurement results of crystal sizes of the ITO films. The ITO films were formed by sputtering under the same conditions as those shown in FIG. 19, and the crystal sizes of the ITO films were calculated from full width at half maximum (FWHM) of (222) diffraction lines by using the Scherrer equation. The Scherrer equation is as follows.

$$D = \frac{0.94\lambda}{\beta \cdot \cos\theta}$$ [Math. 1]

In the above-mentioned equation, D denotes a crystallite size, λ denotes an X-ray wavelength, β denotes a peak width, and θ denotes a Bragg angle of a diffraction line.

Referring to FIG. 22, the crystallite size of the ITO film formed by facing target sputtering varies depending on the conditions, whereas variability in crystallite size was not observed in the ITO films formed by magnetron sputtering.

Figure 23:
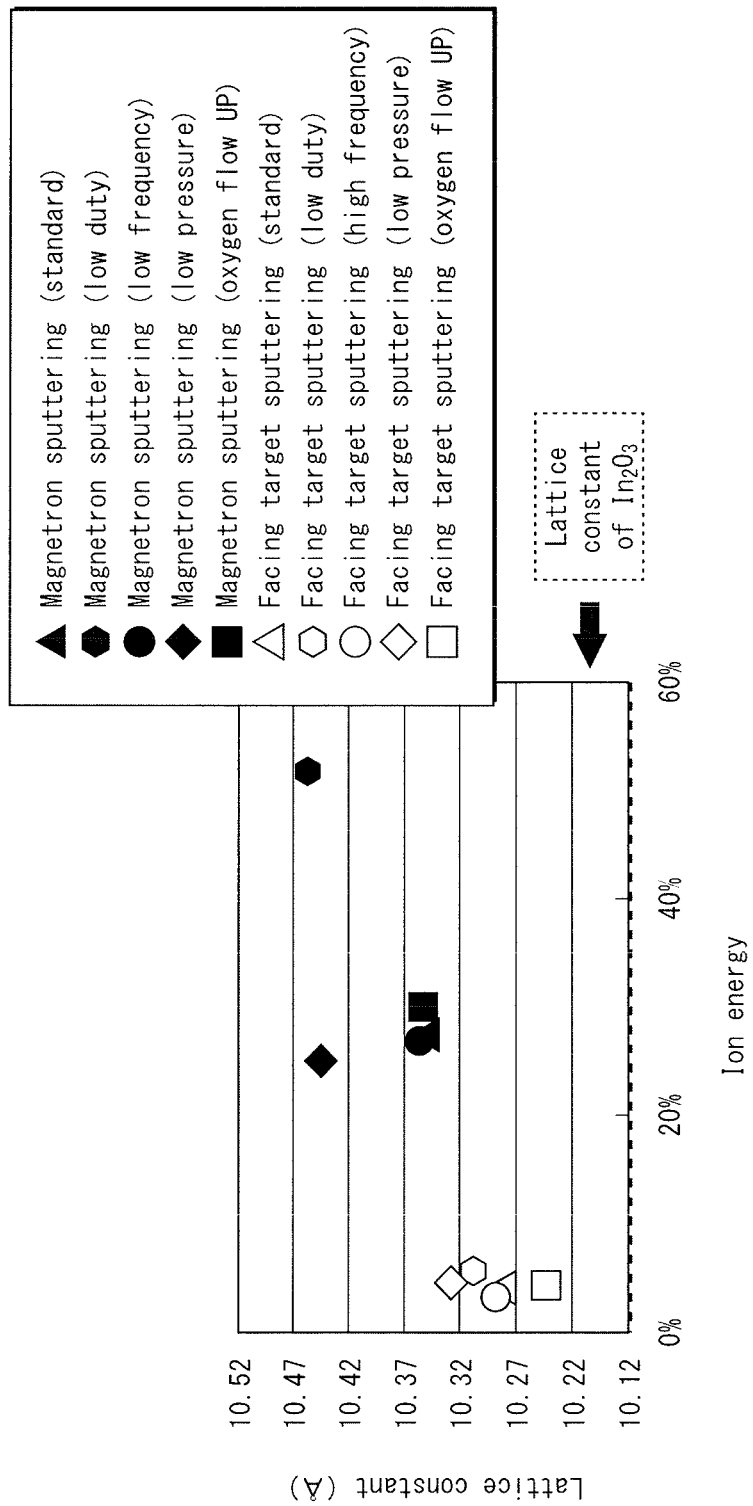
FIG. 23 shows measurement results of lattice constants of crystals of ITO films.

FIG. 23 shows measurement results of lattice constants of crystals of ITO films. The ITO films were formed by sputtering under the same conditions as those shown in FIG. 19, and the lattice constants of the ITO films were calculated from peak positions of (222) diffraction lines. The following describes the equation used to calculate the lattice constants.

$$a = d\sqrt{h^2 + k^2 + l^2}$$ [Math 2]

In the above-mentioned equation, "a" denotes a lattice constant, "d" denotes lattice spacing obtained by using Bragg's law, and "h", "k", and "l" denote plane indices.

Referring to FIG. 23, since the lattice constants of the ITO films formed by magnetron sputtering and by facing target sputtering are larger than a lattice constant of 10.118 Å of $In_2O_3$, crystal strain was observed in the ITO films formed by sputtering. The results show that the crystal strain is larger in the ITO films formed by magnetron sputtering than in the ITO films formed by facing target sputtering. This is attributable to the fact that the amount of Ar ion incident on the film-forming substrate is larger in the ITO films formed by magnetron sputtering than in the ITO films formed by facing target sputtering.

The above-mentioned experimental results led the inventors into the idea that adhesion between an electrode layer and an organic functional layer can be increased by forming the electrode film on the organic functional layer by magnetron sputtering in a high energy process, in which energy of the ion of the sputtering gas incident on the film-forming substrate is greater than that in facing target sputtering, and thus an organic electroluminescent element having high properties, such as a drive voltage and an element lifetime, can be manufactured.

In the primary film-formation step of cathode formation in the method for manufacturing the organic electroluminescent element according to one embodiment of the present invention, it is preferred that the ambient gas pressure be 0.4 Pa or higher from the standpoint of take time in the process of manufacturing the organic electroluminescent element, and be 1.6 Pa or lower from the standpoint of a value of the sheet resistance of the electrode layer. If the ambient gas pressure is too high, the value of the sheet resistance of the electrode layer becomes too high.

Further, according to the experimental results shown in FIG. 19, it is preferred that, in the primary film-formation step of cathode formation, the ion current density per unit dynamic rate be in a range of 0.2 mA/cm² to 0.4 mA/cm² inclusive.

The following describes measurement of the driving efficiency and the element lifetime of the organic electroluminescent element manufactured by forming the electrode by magnetron sputtering in a high energy process to confirm utility of magnetron sputtering in a high energy process.

Figure 24:
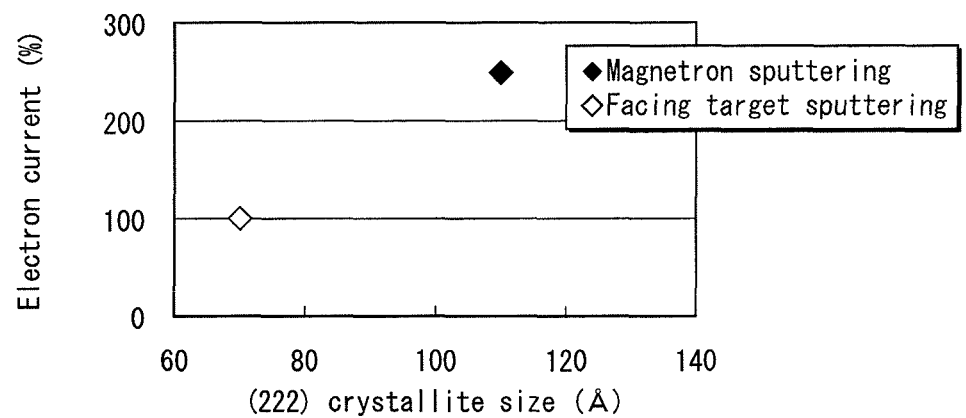
FIG. 24 shows values of current flowing when a voltage of 5 V is applied to organic electroluminescent elements.

FIG. 24 shows values of current flowing when a voltage of 5 V is applied to organic electroluminescent elements. The organic electroluminescent elements are manufactured by forming ITO electrodes on respective organic functional layers by magnetron sputtering and facing target sputtering. Conditions during film formation by magnetron sputtering and facing target sputtering are the same as the standard condition shown in Table 1. That is to say, the power density in magnetron sputtering is 9.0 W/cm². The electron current shown on the vertical axis is a value of the electron current relative to a value of the electron current of the organic electroluminescent element manufactured by forming the ITO electrode by facing target sputtering.

Referring to FIG. 24, upon application of the same voltage, larger current flows through the electroluminescent element manufactured by forming the ITO film on the organic functional layer by magnetron sputtering in a high energy process. This shows that the organic electroluminescent element manufactured by forming the electrode layer on the organic functional layer by magnetron sputtering in a high energy process has high electron injection properties from the electrode into the organic functional layer, and has a high driving efficiency.

Figure 25:
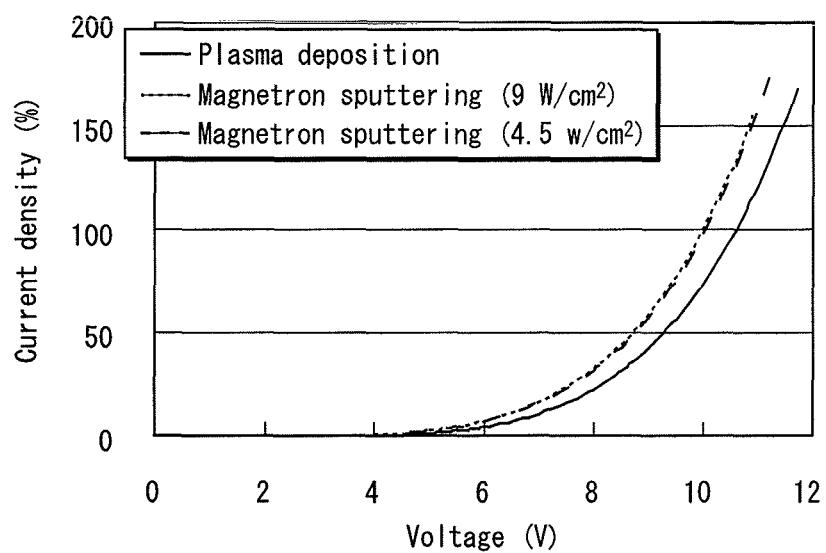
FIG. 25 shows relations between voltage and current density of organic electroluminescent elements.

FIG. 25 shows relations between voltage and current density of organic electroluminescent elements. The organic electroluminescent elements are manufactured by forming ITO films on respective organic functional layers by plasma deposition, magnetron sputtering with a power density of 9.0 W/cm², and magnetron sputtering with a power density of 4.5 W/cm². Conditions during film formation by plasma gun deposition and magnetron sputtering with a power density of 9.0 W/cm² are the same as the standard condition shown in Table 1. A condition during film formation by magnetron sputtering with a power density of 4.5 W/cm² is the standard condition shown in Table 1 except that a condition indicating a power is changed so as to indicate a halved power. The current density shown on the vertical axis is a value of the current density relative to a value of the current density of the organic electroluminescent element manufactured by forming the ITO electrode by magnetron sputtering with a power density of 9.0 W/cm$^2$, and a voltage of 10 V is applied to the organic electroluminescent element thus manufactured.

Referring to FIG. 25, the organic electroluminescent element manufactured by forming the ITO film on the organic functional layer by magnetron sputtering with a power density of 9.0 W/cm$^2$ and the organic electroluminescent element manufactured by forming the ITO film on the organic functional layer by magnetron sputtering with a power density of 4.5 W/cm$^2$ have higher electron injection properties from the electrode into the organic functional layer and a higher driving efficiency than the organic electroluminescent element manufactured by forming the ITO film on the organic functional layer by plasma deposition, which is said to cause low damage.

The experimental results show that, in the primary film-formation step of cathode formation in the method for manufacturing the organic electroluminescent element according to one embodiment of the present invention, it is preferred to form the first cathode layer 102 by magnetron sputtering with a power density of between 4.5 W/cm$^2$ and 9.0 W/cm$^2$ inclusive.

In the secondary film-formation step of cathode formation in the method for manufacturing the organic electroluminescent element according to one embodiment of the present invention, the film formation is considered to be performed with a power density of 4.5 W/cm$^2$.

Figure 26:
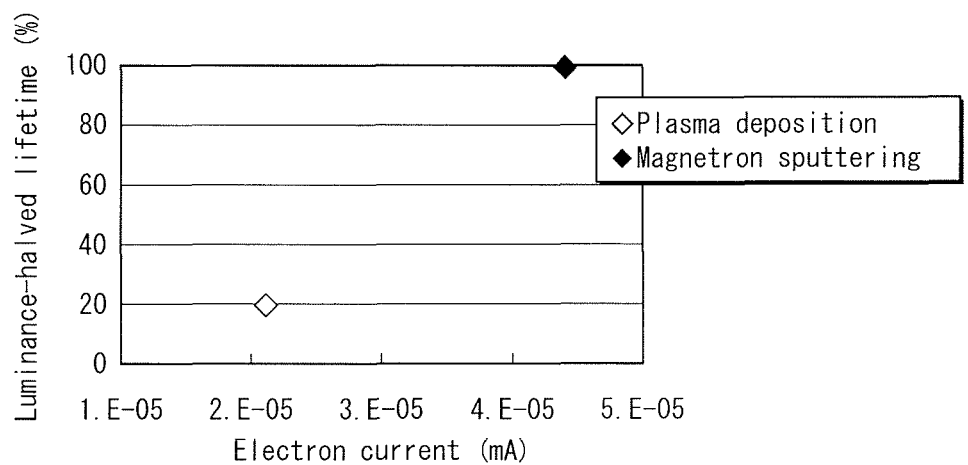
FIG. 26 shows measurement results of luminance-halved lifetimes of organic electroluminescent elements manufactured by forming ITO films on organic functional layers by plasma gun deposition and magnetron sputtering.

FIG. 26 shows measurement results of luminance-halved lifetimes of organic electroluminescent elements manufactured by forming ITO films on respective organic functional layers by plasma deposition and magnetron sputtering. The luminance-halved lifetime shown on the vertical axis is a luminance-halved lifetime relative to a luminance-halved lifetime of the organic electroluminescent element manufactured by forming the ITO film on the organic functional layer by magnetron sputtering. Conditions during film formation by plasma gun deposition and magnetron sputtering are the same as the standard condition shown in Table 1. That is to say, the power density in magnetron sputtering is 9.0 W/cm$^2$.

Referring to FIG. 26, the organic electroluminescent element manufactured by forming the ITO film on the organic functional layer by magnetron sputtering with a power density of 9.0 W/cm$^2$ has a longer lifetime than the organic electroluminescent element manufactured by forming the ITO film on the organic functional layer by plasma gun deposition, which is said to cause low damage.

Figure 27:
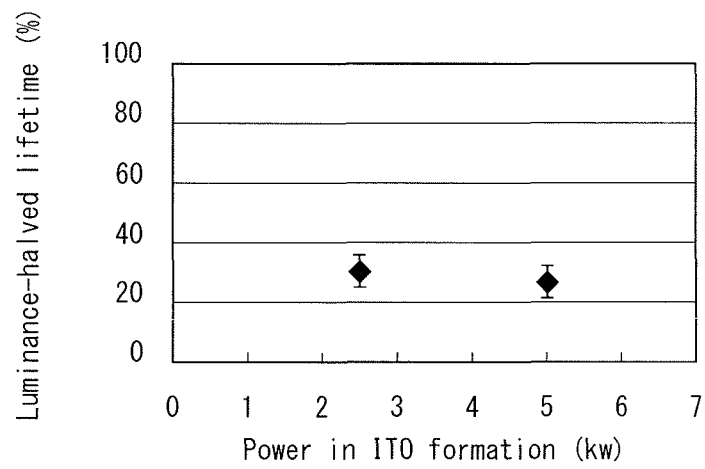
FIG. 27 shows measurement results of luminance-halved lifetimes of organic electroluminescent elements manufactured by forming ITO films on organic functional layers by facing target sputtering.

FIG. 27 shows measurement results of luminance-halved lifetimes of organic electroluminescent elements manufactured by forming ITO films on respective organic functional layers by facing target sputtering. The luminance-halved lifetime shown on the vertical axis is a luminance-halved lifetime relative to a luminance-halved lifetime of the organic electroluminescent element manufactured by forming the ITO film on the organic functional layer by magnetron sputtering with a power density of 9.0 W/cm$^2$ shown in FIG. 26. Referring to FIG. 27, the luminance-halved lifetimes of the organic electroluminescent elements manufactured by forming the ITO films by facing target sputtering do not improve even when the power increases. Presumably, this is because, in facing target sputtering, adhesion between the organic functional layer and the electrode layer cannot be increased due to a small amount of ion of a sputtering gas incident on the film-forming substrate, and thus the electron injection properties from the electrode into the organic functional layer cannot be improved.

Figure 28:
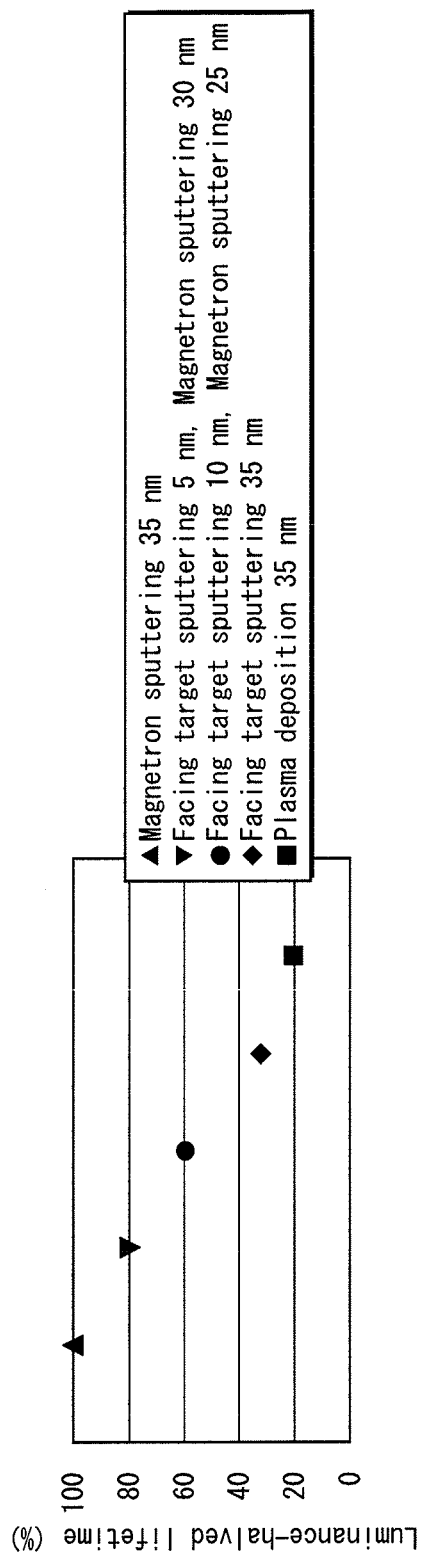
FIG. 28 shows measurement results of luminance-halved lifetimes of organic electroluminescent elements manufactured by forming ITO films on organic functional layers by magnetron sputtering, facing target sputtering, and plasma gun deposition.

FIG. 28 shows measurement results of luminance-halved lifetimes of organic electroluminescent elements manufactured by forming ITO films on respective organic functional layers by magnetron sputtering, facing target sputtering, and plasma deposition. The luminance-halved lifetime shown on the vertical axis is a luminance-halved lifetime relative to a luminance-halved lifetime of an organic electroluminescent element manufactured by forming a 35 mm thick ITO film on an organic functional layer by magnetron sputtering.

Samples are: (1) an organic electroluminescent element manufactured by forming a 35 nm thick ITO film on an organic functional layer by magnetron sputtering; (2) an organic electroluminescent element manufactured by forming, on an organic functional layer, a 5 nm thick ITO film by facing target sputtering, and then a 30 nm thick ITO film by magnetron sputtering; (3) an organic electroluminescent element manufactured by forming, on an organic functional layer, a 10 nm thick ITO film by facing target sputtering, and then a 25 nm thick ITO film by magnetron sputtering; (4) an organic electroluminescent element manufactured by forming a 35 nm thick ITO film on an organic functional layer by facing target sputtering; and (5) an organic element manufactured by forming a 35 nm thick ITO film on an organic functional layer by plasma deposition.

Conditions during film formation by magnetron sputtering, facing target sputtering, and plasma deposition are the same as the standard condition shown in Table 1. That is to say, the power density in magnetron sputtering is 9.0 W/cm$^2$.

Referring to FIG. 28, the organic electroluminescent element manufactured by forming the electrode on the organic functional layer by magnetron sputtering with a power density of 9.0 W/cm$^2$ has higher lifetime properties than the organic electroluminescent elements manufactured by forming the electrodes on the respective organic functional layers by plasma deposition and facing target sputtering.

Presumably, this is because adhesion between the organic functional layer and the upper electrode is increased by forming the upper electrode by magnetron sputtering in a high energy process, in which the amount of ion of a sputtering gas incident on the organic functional layer is large.

Further, a high-efficient, long-lived organic electroluminescent element having high electron injection properties from the upper electrode into the organic functional layer can be manufactured, presumably because damage to the organic functional layer as the underlayer caused by formation of the cathode by magnetron sputtering in a high energy process is not observed, and adhesion between the cathode and the organic functional layer increases.

It is also found that the organic electroluminescent elements each manufactured by forming, on the organic functional layer, an electrode by facing target sputtering, and then another electrode by magnetron sputtering with a power density of 9.0 W/cm$^2$ have higher lifetime properties than the organic electroluminescent elements manufactured by forming the electrodes on the respective organic functional layers by plasma deposition and facing target sputtering.

The results show that the organic electroluminescent element having high lifetime properties can be manufactured by using magnetron sputtering in a high energy process in the process of forming the upper electrode.

Referring to the experimental results shown in FIG. 25, the organic electroluminescent element manufactured by forming the ITO film on the organic functional layer by magnetron sputtering with a power density of 9.0 W/cm$^2$ has approximately equivalent electron injection properties from the electrode into the organic functional layer to those of the organic electroluminescent element manufactured by forming the ITO film on the organic functional layer by magnetron sputtering with a power density of 4.5 W/cm². It is therefore considered that the organic electroluminescent element manufactured by forming the ITO film on the organic functional layer by magnetron sputtering with a power density of 4.5 W/cm² also has high lifetime properties as in the organic electroluminescent element manufactured by forming the ITO film on the organic functional layer by magnetron sputtering with a power density of 9.0 W/cm².

[Summary]

In summary, in the method for manufacturing the organic electroluminescent element according to one embodiment of the present invention, the first cathode layer is formed on the electron transport layer by magnetron sputtering, preferably by magnetron sputtering in a high energy process. As a result, a cathode film having high electron injection properties into the electron transport layer can be formed. On the first cathode layer, the second cathode layer having a low film stress is then formed by reducing the power density or raising the ambient gas pressure in magnetron sputtering. By forming the cathode thin film having a low film stress on the cathode thin film formed by magnetron sputtering, a cathode having high injection properties into the organic functional layer and a reduced film stress can be formed.

[Supplementary Remarks]

Description has been made so far based on the above-mentioned embodiment, but the present invention is in no way limited to the above-mentioned embodiment. The following modifications also fall within a scope of the present invention.

(1) In the above-mentioned embodiment, the organic electroluminescent element includes the cathode, the electron transport layer, the light-emitting layer, the hole transport layer, the hole injection layer, the anode, and the substrate. The present invention, however, is not limited to this structure. As long as the organic electroluminescent element includes an electrode pair composed of the upper electrode and the lower electrode, and one or more organic functional layers interposed between the upper electrode and the lower electrode, the organic electroluminescent element may include, as an organic functional layer, a functional layer other than the functional layers listed herein.

For example, an electron injection layer for promoting injection of electrons from the cathode into the electron transport layer may be provided between the cathode and the electron transport layer. Examples of a material for the electron injection layer are low work function metal such as lithium, barium, calcium, potassium, cesium, sodium and rubidium, low work function metal salt such as lithium fluoride, and low work function metal oxide such as barium oxide. When the cathode is made of ITO, however, desired electron injection properties cannot be obtained as the electron injection layer is oxidized. It is therefore necessary to set a condition such that an Al film is formed prior to the ITO cathode, or the above-mentioned material for the electron injection layer is mixed with an organic material, for example.

The organic electroluminescent element may not include one or more of the functional layers listed herein.

(2) The magnetron sputtering device shown in FIG. 3 is just an example, and magnetron sputtering according to the present invention is not limited to that using the magnetron sputtering device shown in FIG. 3. Magnetron sputtering is a method of applying a magnetic field to a target, capturing secondary electrons dislodged from the target by collision with a surface of the target by using Lorentz force generated by the magnetic field, and causing the secondary electrons to make a cycloidal or trochoidal motion to generate high-density plasma in the vicinity of the target.

[Industrial Applicability]

The method for manufacturing the organic electroluminescent element according to the present invention is applicable to manufacturing of organic EL display elements for use in various display devices, television devices, displays for portable electronic devices, and the like for household use, public use, and business use.

[Reference Signs List]

100 organic electroluminescent element
    101 cathode
    102 first cathode layer
    103 second cathode layer
    104 electron transport layer
    105 light-emitting layer
    106 hole transport layer
    107 hole injection layer
    108 anode
    109 substrate
    300 magnetron sputtering device
    301 sputtering chamber
    302 gas supply system
    303 exhaust system
    304 backing plate
    305 target
    306 magnet
    307 mount
    308 film-forming substrate
    309 power supply

The invention claimed is:

1. A method for manufacturing an organic electroluminescent element that includes: an electrode pair composed of an upper electrode and a lower electrode; and an organic functional layer disposed between the upper electrode and the lower electrode, the method comprising:
    forming the upper electrode on the organic functional layer by magnetron sputtering, wherein
    the forming of the upper electrode includes:
        forming a first thin film made of a material for the upper electrode on the organic functional layer under a first condition; and
        forming a second thin film made of the material for the upper electrode on the first thin film under a second condition different from the first condition, the second thin film having a lower film stress than the first thin film.

2. The method for manufacturing the organic electroluminescent element of claim 1, wherein
    the first condition and the second condition each include a condition relating to power density during film formation, and
    the second condition indicates a lower power density than the first condition.

3. The method for manufacturing the organic electroluminescent element of claim 2, wherein
    the first condition indicates a power density of between 4.5 W/cm² and 9.0 W/cm² inclusive.

4. The method for manufacturing the organic electroluminescent element of claim 1, wherein
    the first condition and the second condition each include a condition relating to ambient gas pressure, and
    the second condition indicates a higher ambient gas pressure than the first condition.

5. The method for manufacturing the organic electroluminescent element of claim 1, wherein
the upper electrode is a cathode,
the lower electrode is an anode,
the organic functional layer is composed of a plurality of layers including an electron transport layer, and
in the forming of the upper electrode, the cathode is formed on the electron transport layer, the cathode being made of a light-transmissive electrically-conductive material.

6. The method for manufacturing the organic electroluminescent element of claim 5, wherein
the light-transmissive electrically-conductive material is made of an oxide containing at least one selected from the group consisting of In, Ti, Zn, and Sn.

* * * * *